US010199211B2

(12) United States Patent
Pore

(10) Patent No.: US 10,199,211 B2
(45) Date of Patent: *Feb. 5, 2019

(54) ATOMIC LAYER DEPOSITION OF SILICON CARBON NITRIDE BASED MATERIALS

(71) Applicant: ASM IP HOLDING B.V., Almere (NL)

(72) Inventor: Viljami Pore, Helsinki (FI)

(73) Assignee: ASM IP HOLDING B.V., Almere (NL)

(*) Notice: Subject to any disclaimer, the term of this patent is extended or adjusted under 35 U.S.C. 154(b) by 0 days.

This patent is subject to a terminal disclaimer.

(21) Appl. No.: 15/820,916

(22) Filed: Nov. 22, 2017

(65) Prior Publication Data
US 2018/0082838 A1 Mar. 22, 2018

Related U.S. Application Data

(60) Continuation of application No. 15/196,985, filed on Jun. 29, 2016, now Pat. No. 9,837,263, which is a
(Continued)

(51) Int. Cl.
H01L 21/02 (2006.01)
C23C 16/455 (2006.01)
(Continued)

(52) U.S. Cl.
CPC ........ H01L 21/02167 (2013.01); C23C 16/30 (2013.01); C23C 16/45553 (2013.01);
(Continued)

(58) Field of Classification Search
CPC ........... H01L 21/0234; H01L 21/02167; H01L 21/02208; H01L 21/02211;
(Continued)

(56) References Cited

U.S. PATENT DOCUMENTS 4,683,147 A 7/1987 Eguchi et al.
4,696,834 A 9/1987 Varaprath
(Continued)

FOREIGN PATENT DOCUMENTS

JP 2006-190770 7/2006
JP 2013-125762 6/2013
(Continued)

OTHER PUBLICATIONS

Pedersen, et al. "Low Temperature CVD of Thin, Amorphous Boron-Carbon Films for Neutron Detectors," 2012, Chemical Vapor Deposition, (18), 7-9, 221-224.
(Continued)

*Primary Examiner* — Savitr Mulpuri
(74) *Attorney, Agent, or Firm* — Knobbe, Martens, Olson & Bear LLP

(57) ABSTRACT

A process for depositing a silicon carbon nitride film on a substrate can include a plurality of complete deposition cycles, each complete deposition cycle having a SiN sub-cycle and a SiCN sub-cycle. The SiN sub-cycle can include alternately and sequentially contacting the substrate with a silicon precursor and a SiN sub-cycle nitrogen precursor. The SiCN sub-cycle can include alternately and sequentially contacting the substrate with carbon-containing precursor and a SiCN sub-cycle nitrogen precursor. The SiN sub-cycle and the SiCN sub-cycle can include atomic layer deposition (ALD). The process for depositing the silicon carbon nitride film can include a plasma treatment. The plasma treatment can follow a completed plurality of complete deposition cycles.

21 Claims, 14 Drawing Sheets

Related U.S. Application Data division of application No. 14/566,491, filed on Dec. 10, 2014, now Pat. No. 9,401,273.

(60) Provisional application No. 61/914,882, filed on Dec. 11, 2013.

(51) Int. Cl.
  C23C 16/30 (2006.01)
  H01L 21/311 (2006.01)
(52) U.S. Cl.
  CPC ...... *H01L 21/0228* (2013.01); *H01L 21/0234* (2013.01); *H01L 21/02208* (2013.01); *H01L 21/02211* (2013.01); *H01L 21/31111* (2013.01)
(58) Field of Classification Search
  CPC ........... H01L 21/31111; H01L 21/0228; C23C 16/30; C23C 16/45553
  See application file for complete search history.

(56) References Cited

U.S. PATENT DOCUMENTS

| | | | |
|---|---|---|---|
| 6,475,276 B1 | 11/2002 | Elers et al. | |
| 6,586,056 B2 | 7/2003 | Arkles et al. | |
| 6,933,245 B2 | 8/2005 | Lee et al. | |
| 7,625,609 B2 | 12/2009 | Matsuura | |
| 7,651,955 B2 | 1/2010 | Ranish et al. | |
| 8,080,290 B2 | 12/2011 | Hasebe et al. | |
| 8,114,761 B2 | 2/2012 | Mandrekar et al. | |
| 8,119,544 B2 | 2/2012 | Hasebe et al. | |
| 8,242,031 B2 | 8/2012 | Mallick et al. | |
| 8,329,599 B2* | 12/2012 | Fukazawa | C23C 16/30 438/783 |
| 8,563,096 B2 | 10/2013 | Matsunaga et al. | |
| 8,563,443 B2* | 10/2013 | Fukazawa | C23C 16/30 257/E21.233 |
| 8,580,664 B2 | 11/2013 | Clark | |
| 8,722,546 B2* | 5/2014 | Fukazawa | H01L 21/02167 257/E21.001 |
| 9,362,109 B2* | 6/2016 | Pore | H01L 21/0217 |
| 2001/0012701 A1 | 8/2001 | Kang et al. | |
| 2002/0061659 A1 | 5/2002 | Abe | |
| 2002/0119327 A1 | 8/2002 | Arkles et al. | |
| 2002/0180028 A1 | 12/2002 | Borovik et al. | |
| 2003/0097987 A1 | 5/2003 | Fukuda | |
| 2003/0215570 A1 | 11/2003 | Seutter et al. | |
| 2003/0228770 A1 | 12/2003 | Lee et al. | |
| 2004/0121085 A1 | 6/2004 | Wang et al. | |
| 2004/0146644 A1 | 7/2004 | Xiao et al. | |
| 2005/0025885 A1 | 2/2005 | McSwiney et al. | |
| 2005/0145177 A1 | 7/2005 | McSwiney et al. | |
| 2005/0159017 A1 | 7/2005 | Kim et al. | |
| 2005/0181633 A1 | 8/2005 | Hochberg et al. | |
| 2006/0019032 A1 | 1/2006 | Wang et al. | |
| 2006/0084283 A1 | 4/2006 | Paranjpe et al. | |
| 2006/0148271 A1 | 7/2006 | Borovik et al. | |
| 2007/0116888 A1 | 5/2007 | Faguet | |
| 2007/0232071 A1 | 10/2007 | Balseanu et al. | |
| 2007/0251444 A1 | 11/2007 | Gros-Jean et al. | |
| 2008/0020591 A1 | 1/2008 | Balseanu et al. | |
| 2008/0242116 A1 | 10/2008 | Clark | |
| 2008/0274605 A1 | 11/2008 | Hoshi et al. | |
| 2008/0292798 A1 | 11/2008 | Huh et al. | |
| 2009/0155606 A1 | 6/2009 | Yoon et al. | |
| 2009/0163041 A1 | 6/2009 | Mungekar et al. | |
| 2009/0263972 A1 | 10/2009 | Balseanu et al. | |
| 2009/0311857 A1 | 12/2009 | Todd et al. | |
| 2010/0041243 A1 | 2/2010 | Cheng et al. | |
| 2010/0124621 A1 | 5/2010 | Kobayashi et al. | |
| 2010/0304574 A1 | 12/2010 | Nodera et al. | |
| 2011/0086516 A1 | 4/2011 | Lee et al. | |
| 2011/0129990 A1 | 6/2011 | Mandrekar et al. | |
| 2011/0183528 A1 | 7/2011 | Wang et al. | |
| 2011/0256734 A1 | 10/2011 | Hausmann et al. | |
| 2012/0009802 A1 | 1/2012 | LaVoie et al. | |
| 2012/0021127 A1 | 1/2012 | Sato et al. | |
| 2012/0028469 A1 | 2/2012 | Onizawa et al. | |
| 2012/0077350 A1 | 3/2012 | Miya et al. | |
| 2012/0164848 A1 | 6/2012 | Fujii et al. | |
| 2012/0178264 A1 | 7/2012 | Murakami et al. | |
| 2012/0196450 A1 | 8/2012 | Balseanu et al. | |
| 2012/0213940 A1 | 8/2012 | Mallick | |
| 2013/0040447 A1 | 2/2013 | Swaminathan et al. | |
| 2013/0078392 A1 | 3/2013 | Xiao et al. | |
| 2013/0084714 A1 | 4/2013 | Oka et al. | |
| 2013/0115763 A1 | 5/2013 | Takamure et al. | |
| 2013/0157466 A1 | 6/2013 | Fox et al. | |
| 2013/0171839 A1 | 7/2013 | Nguyen et al. | |
| 2013/0175621 A1 | 7/2013 | Chen et al. | |
| 2013/0224964 A1 | 8/2013 | Fukazawa et al. | |
| 2013/0252439 A1 | 9/2013 | Hirose et al. | |
| 2013/0337583 A1 | 12/2013 | Kobayashi et al. | |
| 2014/0023794 A1 | 1/2014 | Mahajani et al. | |
| 2014/0030444 A1 | 1/2014 | Swaminathan et al. | |
| 2014/0073144 A1 | 3/2014 | Chatterjee et al. | |
| 2014/0113457 A1 | 4/2014 | Sims et al. | |
| 2014/0124841 A1 | 5/2014 | Xie et al. | |
| 2014/0193983 A1 | 7/2014 | LaVoie | |
| 2014/0227458 A1 | 8/2014 | Karakawa | |
| 2014/0273528 A1 | 9/2014 | Niskanen et al. | |
| 2014/0273529 A1 | 9/2014 | Nguyen et al. | |
| 2014/0302688 A1* | 10/2014 | Underwood | H01L 21/02216 438/786 |
| 2014/0342573 A1 | 11/2014 | Hirose et al. | |
| 2014/0363980 A1 | 12/2014 | Kawamata et al. | |
| 2015/0031218 A1 | 1/2015 | Karakawa | |
| 2015/0104954 A1 | 4/2015 | Pore | |
| 2015/0104955 A1 | 4/2015 | Pore | |
| 2015/0206719 A1 | 7/2015 | Swaminathan et al. | |
| 2015/0287591 A1 | 10/2015 | Pore et al. | |
| 2017/0051405 A1 | 2/2017 | Fukazawa et al. | |

FOREIGN PATENT DOCUMENTS

| | | |
|---|---|---|
| WO | WO 2012/144523 | 10/2012 |
| WO | WO 2013/121936 | 8/2013 |

OTHER PUBLICATIONS

Cho, Namtae, "Processing of Boron Carbide," Ph.D. Thesis, School of Materials Science and Engineering, Georgia Institute of Technology, 2006, in 89 pages.

Domnich, et al., "Boron Carbide: Structures, Properties, and Stability under Stress," J. Am. Ceram. Soc., vol. 94., No. 11, 2011, pp. 3605-3628.

Pedersen et al., "Low Temperature CVD of Thin, Amorphous Boron-Carbon Films for Neutron Detectors," Chemical Vapor Deposition, vol. 18, Issue 7-9, 2012, pp. 221-224.

Sarubbi, et al., "Pure Boron-Doped Photodiodes: a Solution for Radiation Detection in EUV Lithography," ESSDERC 2008—38th European Solid-State Device Research Conference, 2008, pp. 278-281.

Final Office Action dated Feb. 24, 2015 in U.S. Appl. No. 14/167,904.

Keinan et al., "Diiodosilane. 1. A Novel Reagent for Deoxygenation of Alcohols and Ethers," J.Org. Chem., 1987, vol. 52, pp. 4846-4851.

Keinan et al., "Diiodosilane. 2. A Multipurpose Reagent for Hydrolysis and Reductive Iodination of Ketals, Acetals, Ketones, and Aldehydes," J. Org. Chem., 1990, vol. 55, pp. 2927-2938.

Keinan et al., "Diiodosilane. 3. Direct Synthesis of Acyl Iodides from Carboxylic Acids, Esters, Lactones, Acyl Chlorides, and Anhydrides," J. Org. Chem., 1990, vol. 55, pp. 3922-3926.

Lowenstein et al., "Chemical Etching of Thermally Oxidized Silicon Nitride: Comparison of Wet Dry Etching Methods," Journal of the Electrochemical Society 138.5, 1991, pp. 1389-1394.

Office Action dated Jun. 17, 2014 in U.S. Appl. No. 14/167,904.
Office Action dated Jun. 5, 2014 in U.S. Appl. No. 14/062,328.
Office Action dated Oct. 6, 2015 in U.S. Appl. No. 14/167,904.

(56) References Cited

OTHER PUBLICATIONS

Tamizhmani et al., "Physical Characterization of a-Si Thin Films Deposited by Thermal Decomposition of Iodosilanes," J. Phys. D: Appl. Phys., 1991, vol. 24, pp. 1015-1021.
Tamizhmani et al., "Some Physical Properties of Undoped Amorphous Silicon Prepared by a New Chemical Vapor Deposition Process Using Iodosilanes," Chem. Mater., 1990, vol. 2, pp. 473-476.
Triyoso et al., "Robust PEALD SiN spacer for gate first high-k metal gate integration", IEEE, 2012, 4 pages.

* cited by examiner

| Sample | Film Thickness (nm) | C (atomic %) | N (atomic %) | O (atomic %) | Si (atomic %) |
|---|---|---|---|---|---|
| SiCN-1, -80Å depth | 19 | 5.2 | 35.0 | 9.0 | 50.8 |
| SiCN-2, -80Å depth | 26 | 9.9 | 29.6 | 14.9 | 45.6 |

FIG. 3

| Sample | C (atomic %) | N (atomic %) | O (atomic %) | Si (atomic %) |
|---|---|---|---|---|
| *Sample surface* | | | | |
| SiCN-1 | 9.5 | 24.3 | 34.5 | 31.7 |
| SiCN-1 after H plasma | 18.3 | 23.4 | 28.2 | 30.2 |
| SiCN-2 | 19.3 | 20.5 | 31.6 | 28.7 |
| SiCN-2 after H plasma | 14.1 | 20.9 | 32.8 | 32.2 |
| *After 80Å sputtering* | | | | |
| SiCN-1 | 5.2 | 35.0 | 9.0 | 50.8 |
| SiCN-1 after H plasma | 5.3 | 36.7 | 7.8 | 50.2 |
| SiCN-2 | 9.9 | 29.6 | 14.9 | 45.6 |
| SiCN-2 after H plasma | 10.1 | 30.2 | 13.3 | 46.4 |

| Sample | C-Si | | C-C | | | C-O | | | O-C=O | | |
|---|---|---|---|---|---|---|---|---|---|---|---|
| | B.E | atom% C | B.E | atom% C | | B.E | atom% C | | B.E | atom% C | |
| *Sample surface* | | | | | | | | | | | |
| SiCN-1 | - | - | 284.8 | 7.8 | | 286.9 | 1.3 | | 289.0 | 0.4 | |
| SiCN-1 after H plasma | 283.2 | 2.4 | 284.8 | 9.5 | | 286.4 | 6.4 | | - | - | |
| SiCN-2 | - | - | 284.8 | 14.6 | | 286.8 | 4.2 | | 288.9 | 0.5 | |
| SiCN-2 after H plasma | 283.3 | 2.3 | 284.8 | 8.7 | | 286.5 | 2.7 | | 288.4 | 0.4 | |
| *After 80Å sputtering* | | | | | | | | | | | |
| SiCN-1 | 283.8 | 4.3 | 285.7 | 0.8 | | 287.9 | 0.1 | | - | - | |
| SiCN-1 after H plasma | 283.9 | 4.0 | 285.6 | 0.8 | | 287.5 | 0.5 | | - | - | |
| SiCN-2 | 284.1 | 8.1 | 286.0 | 1.4 | | 287.9 | 0.4 | | - | - | |
| SiCN-2 after H plasma | 284.1 | 8.3 | 285.9 | 1.5 | | 287.9 | 0.4 | | - | - | |

ATOMIC LAYER DEPOSITION OF SILICON CARBON NITRIDE BASED MATERIALS

REFERENCE TO RELATED APPLICATIONS

The present application is a continuation of U.S. patent application Ser. No. 15/196,985, filed on Jun. 29, 2016, which is a divisional of U.S. patent application Ser. No. 14/566,491, filed on Dec. 10, 2014, now U.S. Pat. No. 9,401,273, which claims priority to U.S. Provisional Application No. 61/914,882, filed Dec. 11, 2013, each of which is hereby incorporated by reference in its entirety.

BACKGROUND

Field

The present disclosure relates generally to the field of semiconductor device manufacturing and, more particularly, to deposition of silicon nitride based films.

Description of the Related Art

As the physical geometry of semiconductor devices shrinks, deposition processes for forming silicon nitride based films on three-dimensional structures having high aspect ratios is desired. Additionally, it is desirable to be able to deposit silicon nitride based films that demonstrate an advantageous etch selectivity with respect one or more other materials in the formation of a semiconductor device, and/or a desirable etch rate in a dry etch and/or wet etch process.

Deposition of silicon nitride based films having desired characteristics by atomic layer deposition (ALD) processes using reduced thermal budgets can be difficult (e.g., such as at reduced temperatures, including at temperatures of less than about 600° C.). Silicon nitride based films deposited by conventional processes (e.g., silicon nitride based film deposited using plasma enhanced ALD (PEALD)) performed at reduced temperatures may result in films having undesirably low conformality and/or undesirably low film quality inside three-dimensional structures. The low conformality and/or reduced film quality may be due to the anisotropic nature of direct plasmas. Silicon nitride based films formed using conventional methods may also undesirably demonstrate high etch rates and/or have low etch selectivity to another different material in a semiconductor device (e.g., a thermal silicon oxide material, TOX), such that the silicon nitride film cannot withstand one or more subsequent thermal silicon oxide etch steps used in the device fabrication process. For example, the wet etch rate (WER) in dilute aqueous hydrofluoric acid solution (e.g., dHF, or aqueous hydrofluoric acid solution having a concentration of about 0.5 weight %) of a silicon nitride based film deposited using conventional means at temperatures of below about 600° C. typically are too high, for example in comparison to another layer in the film stack (e.g., a TOX layer).

SUMMARY

Processes for depositing silicon carbon nitride films on a substrate can include a plurality of complete deposition cycles, each complete deposition cycle comprising a SiN sub-cycle and a SiCN sub-cycle, where the SiN sub-cycle can include alternately and sequentially contacting the substrate with a silicon precursor and a first nitrogen precursor (also referred to as a SiN sub-cycle nitrogen precursor). The SiCN sub-cycle can include alternately and sequentially contacting the substrate with a precursor comprising silicon and carbon and a second nitrogen precursor (also referred to as a SiCN sub-cycle nitrogen precursor). In some embodiments, the process can include exposing the silicon carbon nitride film to a plasma treatment, for example to improve one or more film qualities. In some embodiments, the plasma treatment follows the completion of the plurality of complete deposition cycles.

In some embodiments methods for improving film properties of a silicon carbon nitride film can include exposing the silicon carbon nitride film to a hydrogen-containing plasma treatment process. A reactant gas for the hydrogen-containing plasma can comprise hydrogen gas ($H_2$) and a noble gas. In some embodiments, a reactant gas for the hydrogen-containing plasma consists of hydrogen gas ($H_2$) and a noble gas. In some embodiments, the noble gas can be argon (Ar).

In some embodiments, processes for forming silicon carbon nitride films can include depositing a silicon carbon nitride film on a substrate and treating the silicon carbon nitride film to a hydrogen-containing plasma. In some embodiments, depositing the silicon carbon nitride film includes performing at least one SiCN deposition cycle, where the at least one SiCN deposition cycle includes alternately and sequentially contacting the substrate with a precursor comprising silicon and carbon, and a SiCN deposition cycle nitrogen precursor.

For purposes of summarizing the invention and the advantages achieved over the prior art, certain objects and advantages are described herein. Of course, it is to be understood that not necessarily all such objects or advantages need to be achieved in accordance with any particular embodiment. Thus, for example, those skilled in the art will recognize that the invention may be embodied or carried out in a manner that can achieve or optimize one advantage or a group of advantages without necessarily achieving other objects or advantages.

All of these embodiments are intended to be within the scope of the invention herein disclosed. These and other embodiments will become readily apparent to those skilled in the art from the following detailed description having reference to the attached figures, the invention not being limited to any particular disclosed embodiment(s).

BRIEF DESCRIPTION OF THE DRAWINGS

These and other features, aspects, and advantages of the present disclosure are described with reference to the drawings of certain embodiments, which are intended to illustrate certain embodiments and not to limit the invention.

FIG. 3 is a table providing the composition of examples of silicon carbon nitride (SiCN) films.

FIG. 13 is a table providing the composition of silicon carbon nitride (SiCN) films.

FIG. 14 is a table providing the composition of silicon carbon nitride (SiCN) films.

DETAILED DESCRIPTION

Figure 1:
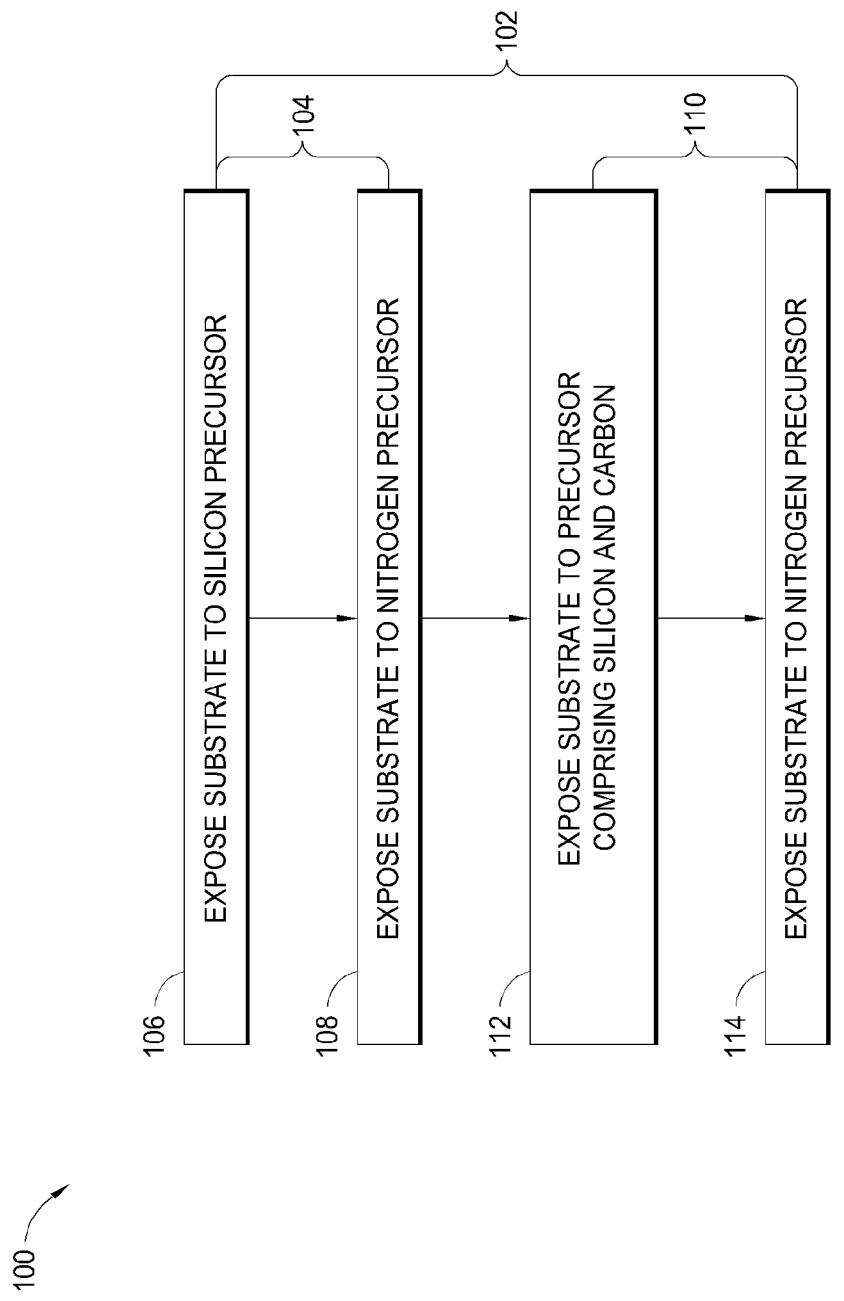
FIG. 1 shows an example of a process for forming a silicon carbon nitride material on a substrate.

Although certain embodiments and examples are described below, those of skill in the art will appreciate that the invention extends beyond the specifically disclosed embodiments and/or uses and includes obvious modifications and equivalents thereof. Thus, it is intended that the scope of the invention herein disclosed should not be limited by any particular embodiments described below.

In some embodiments, a process of fabricating a silicon nitride based material containing carbon, or a silicon carbon nitride (SiCN) film, having desirable characteristics (e.g., desired conformality and/or reduced wet etch rate in dilute aqueous hydrofluoric acid solution) can include a thermal atomic layer deposition (ALD) process performed at reduced temperatures (e.g., at less than about 600° C., including about 300° C. to about 600° C., and about 400° C. to about 500° C.). In some embodiments, addition of carbon into a silicon nitride film can advantageously provide a film having desirable characteristics, such as a film demonstrating a reduced wet etch rate while maintaining desired conformality with respect to underlying three-dimensional structures, and without or substantially without increasing a k-value of the film. In some embodiments, addition of carbon into a silicon nitride film can be achieved by using a precursor comprising silicon and carbon in the film deposition process. In some embodiments, a film wet etch rate of a silicon carbon nitride film can be adjusted by adjusting the number of cycles of the deposition process which includes the precursor comprising silicon and carbon. For example, a thermal ALD process can include a number of cycles which includes the precursor comprising silicon and carbon to achieve a desired carbon content in the deposited silicon carbon nitride film, so as to facilitate the desired wet etch performance. In some embodiments, the selection of the precursor comprising silicon and carbon may facilitate formation of a silicon carbon nitride film having desired wet etch performance. In some embodiments, precursors of the thermal ALD process can have sufficiently high vapor pressures such that the process can be carried out in a batch reactor for increased throughput.

In some embodiments, a process of fabricating a SiCN film can include a combination of a thermal ALD process and a plasma treatment. For example, the process can include a thermal ALD process followed by a plasma treatment. The number of repetitions of the thermal ALD process number of repetitions of the plasma treatment, and/or the process parameters of the thermal ALD process and/or the process parameters of the plasma treatment, can be optimized to provide a SiCN film having desired characteristics (e.g., including formation of films having desired characteristics on three-dimensional (3-D) structures having aspect ratios of at least about 6).

In some embodiments, SiCN films treated by a plasma treatment process have very low to negligible dHF etch rates. In some embodiments, one or more plasma treatment units can be combined in a cluster tool with one or more batch reactors for performing thermal ALD processes, facilitating integration of the SiCN film formation process.

Silicon nitride based layers are widely used in semiconductor manufacturing. For example, silicon nitride based films can be a part of semiconductor devices, and/or fabrication processes for various semiconductor devices, including for example various transistors (e.g., FinFETs). In some embodiments, silicon nitride films can be deposited on a three-dimensional feature such as a spacer material on a gate feature of a transistor, used as a sacrificial layer and/or as an etch stop layer, in the fabrication process.

In some embodiments, one or more processes described herein can be used to form a silicon carbon nitride film having a desirable wet etch rate relative to that of thermally grown silicon oxide (TOX). In some embodiments, a silicon carbon nitride film formed according to one or more processes described herein can demonstrate a wet etch rate ratio (WERR) relative to TOX of less than about 1:1, more preferably less than about 1:2. In some embodiments, a silicon carbon nitride film formed according to one or more processes described herein can demonstrate a WERR relative to TOX of about 1:5 or less, about 1:10 or less, or about 1:20 or less. For example, a wet etch rate of thermally grown silicon oxide in a dilute aqueous hydrofluoric acid solution (e.g., dHF, an aqueous HF acid solution having a concentration of about 0.5 weight %) can be about 2 nanometers per minute (nm/min) to about 3 nm/min. Such silicon carbon nitride films may be used, for example, in gate spacer applications. In some embodiments, it can be advantageous for a gate spacer comprising the silicon carbon nitride film to withstand or substantially withstand an etch step for removing a thermal oxide layer having a certain thickness, including a thermal oxide layer having a thickness of about 1 nanometer (nm) to about 10 nm, about 4 nm to about 10 nm, about 1.5 nm to about 5 nm, or about 2 nm to about 3 nm. In some embodiments, a silicon carbon nitride film formed according to one or more processes described herein can withstand or substantially withstand an etch step for removing a thermal oxide layer having a thickness of greater than 10 nm.

Deposition of Silicon Carbon Nitride Films

In some embodiments, a process of depositing a silicon carbon nitride (SiCN) film comprises both a deposition process for depositing a silicon nitride (SiN) component (e.g., a number of deposition cycles for depositing a SiN, such as a number of SiN sub-cycles), and a deposition process for adding a carbon component to the growing film (e.g., a number of deposition cycles which includes a precursor comprising silicon and carbon, such as a number of SiCN sub-cycles). For example, a process for fabricating a SiCN film can include a number of complete cycles, each complete cycle including a number of SiN sub-cycles and a number of SiCN sub-cycles. In some embodiments, a process of fabricating a SiCN film having desired characteristics can include a number of complete cycles, where each complete cycle includes a ratio of a number of SiN sub-cycles to a number of SiCN sub-cycles optimized to obtain the desired characteristics, such as wet etch rate. The ratio of the number of SiN sub-cycles to the number of SiCN sub-cycles of a complete cycle can be expressed as having a percentage of SiCN sub-cycles (e.g., a SiCN sub-cycle percentage or a SiCN deposition sub-cycle percentage). For example, a complete cycle for depositing a SiCN film including one deposition cycle for depositing a SiN component (e.g., one SiN sub-cycle) and four deposition cycles for adding a carbon component (e.g., four SiCN sub-cycles) can have a SiCN sub-cycle percentage of about 80%. In some embodiments, a complete cycle can have SiCN sub-cycle percentage of about 10% to about 100%, including about 25% to about 98%, about 50% to about 95%, and about 75% to about 85%.

In some embodiments, one or more parameters of a SiN sub-cycle can be different from that of another SiN sub-cycle. In some embodiments, one or more parameters of a SiN sub-cycle can be similar to or the same as that of another SiN sub-cycle such that the SiN sub-cycles are performed under similar or identical process conditions. In some embodiments, one or more parameters of a SiCN sub-cycle can be different from that of another SiCN sub-cycle. In some embodiments, one or more parameters of a SiCN sub-cycle can be similar to or the same as that of another SiCN sub-cycle such that the SiCN sub-cycles are performed under similar or even identical process conditions.

In some embodiments, a silicon carbon nitride film formed according to one or more processes described herein is not a nanolaminate film. That is, separate and distinct layers may not be visible within the silicon carbon nitride film. For example, a continuous or substantially continuous silicon carbon nitride film may be formed.

As described above, in some embodiments, a process for forming a silicon carbon nitride (SiCN) film of a desired thickness and/or composition can include an ALD deposition process (e.g., a SiN deposition sub-cycle and/or a SiCN deposition sub-cycle can comprise an ALD process). ALD type processes are based on controlled surface reactions that are typically self-limiting. Gas phase reactions are avoided by contacting the substrate alternately and sequentially with precursors, although in some instances, some overlap is possible. Vapor phase precursors are separated from each other in the reaction chamber, for example, by removing excess precursors and/or precursor byproducts from the reaction chamber between precursor pulses. For example, an ALD deposition process can include contacting a substrate with a first precursor (e.g., a silicon precursor for a SiN deposition sub-cycle or a precursor comprising silicon and carbon for a SiCN deposition sub-cycle) such that the first precursor adsorbs onto the substrate surface, and contacting the substrate with a second precursor (e.g., a nitrogen precursor of a SiN deposition sub-cycle or a nitrogen precursor of a SiCN deposition sub-cycle). Exposure of the substrate to the first precursor and the second precursor can be repeated as many times as required to achieve a film of a desired thickness and composition. Excess precursors may be removed from the vicinity of the substrate, for example by evacuating the reaction chamber and/or purging from the reaction space with an inert gas, after each contacting step. For example, excess reactants and/or reaction byproducts may be removed from the reactor chamber between precursor pulses by drawing a vacuum on the reaction chamber to evacuate excess reactants and/or reaction byproducts. In some embodiments, the reaction chamber may be purged between precursor pulses. The flow rate and time of each precursor, is tunable, as is the purge step, allowing for control of the dopant concentration and depth profile in the film.

Each cycle of an ALD process can include at least two distinct processes or phases. The provision and removal of a precursor from the reaction space may be considered a phase. In a first process or phase of an ALD process of a SiN deposition sub-cycle, for example, a first precursor comprising silicon is provided and forms no more than about one monolayer on the substrate surface. This precursor is also referred to herein as "the silicon precursor" or "silicon reactant." In a second process or phase of the ALD process of a SiN deposition sub-cycle, for example, a second precursor comprising a nitrogen-containing compound is provided and reacts with the adsorbed silicon precursor to form SiN. This second precursor may also be referred to as a "nitrogen precursor" or "nitrogen reactant." As described herein, the second precursor may comprise ammonia ($NH_3$) and/or another suitable nitrogen-containing compound that is able to react with the adsorbed first reactant under the process conditions. Preferably the reaction leaves a termination that is further reactive with the first precursor or another precursor for a different phase. Additional processes or phases may be added and phases may be removed as desired to adjust the composition of the final silicon carbon nitride (SiCN) film. In some embodiments, the additional processes or phases can include one or more precursors different from that of the first and second process or phase. For example, one or more additional precursors can be provided in the additional processes or phases. In some embodiments, the additional processes or phases can have similar or identical process conditions as that of the first and second process or phase. In some embodiments for a silicon nitride (SiN) deposition sub-cycle, one or more deposition sub-cycles typically begins with provision of the silicon precursor followed by the nitrogen precursor. In some embodiments, one or more deposition sub-cycles begins with provision of the nitrogen precursor followed by the silicon precursor. One or more of the precursors may be provided with the aid of a carrier gas, such as nitrogen ($N_2$), argon (Ar) and/or helium (He). In some embodiments, the carrier gas may comprise another inert gas.

In some embodiments, in a first process or phase of an ALD process of a SiCN deposition sub-cycle, for example, a first precursor comprising silicon and carbon is provided and forms no more than about one monolayer on the substrate surface. This precursor is also referred to herein as "the precursor comprising silicon and carbon" or "the reactant comprising silicon and carbon." In a second process or phase of the ALD process of a SiCN deposition sub-cycle, for example, a second precursor comprising a nitrogen-containing compound is provided and reacts with the adsorbed precursor comprising the silicon and carbon to form SiCN, thereby introducing carbon into the silicon nitride film. This second precursor may also be referred to as a "nitrogen precursor" or "nitrogen reactant." As described herein, the second precursor may comprise ammonia ($NH_3$) and/or another suitable nitrogen-containing compound. The nitrogen precursor of the SiCN deposition sub-cycle may be the same as or different from a nitrogen precursor of the SiN deposition sub-cycle. Additional processes or phases may be added and phases may be removed as desired to adjust the composition of the final film. In some embodiments for depositing a silicon carbon nitride (SiCN) film, one or more SiCN deposition sub-cycles typically begins with provision of the precursor comprising the silicon and carbon followed by the nitrogen precursor. In some embodiments, one or more deposition sub-cycles begins with provision of the nitrogen precursor followed by the precursor comprising the silicon and carbon. One or more of the precursors of the SiCN sub-cycle may be provided with the aid of a carrier gas, such as nitrogen ($N_2$), Ar and/or He. In some embodiments, the carrier gas may comprise another inert gas.

FIG. 1 shows a flow chart of an example of a process 100 for forming a silicon nitride film comprising carbon (e.g., a SiCN film) on a substrate. In some embodiments the process is a thermal ALD process. The process 100 can include a complete cycle 102 having a SiN sub-cycle 104. In some embodiments, the process 100 includes a second sub-cycle to add carbon components to the film. As shown in FIG. 1, the process 100 can include a SiCN sub-cycle 110 for adding carbon components to the growing SiCN film. In some embodiments, the SiN sub-cycle 104, SiCN sub-cycle 110, and/or the complete cycle 102 can be repeated a number of times to form a SiCN film having a desired composition and/or thickness. The ratio of the SiN sub-cycle 104 to the SiCN sub-cycle 110 can be varied to tune the concentration of carbon in the film and thus to achieve a film with desired characteristics. For example, the number of times SiCN sub-cycle 110 is repeated relative to the number of times the SiN sub-cycle 104 is repeated can be selected to provide a SiCN film with desired characteristics (e.g., desired wet etch rate).

The SiN sub-cycle 104 can include blocks 106 and 108. In block 106, the substrate can be exposed to a silicon reactant. In block 108, the substrate can be exposed to a nitrogen reactant. In some embodiments, SiN sub-cycle 104 can be repeated a number of times (e.g., a number of repetitions of the blocks 106 followed by 108). In some embodiments, block 106 or block 108 can be repeated a number of times before performing one or more times the other block. For example, block 106 can be repeated a number of times before performing block 108.

In some embodiments pulses of the silicon precursor for exposing the substrate to the silicon precursor and pulses of nitrogen precursor for exposing the substrate to the nitrogen precursor are separated by a step of removing excess silicon precursor from the reactor (not shown). In some embodiments excess nitrogen precursor is removed prior to repeating the SiN sub-cycle 104. In some embodiments, the SiN sub-cycle 104 is an ALD process. In some embodiments, the pulses of the silicon and nitrogen precursor may at least partially overlap. In some embodiments, no additional precursors are provided to the reaction chamber either between blocks 106 and 108, or before starting blocks 106 and 108.

The SiCN sub-cycle 110 for introducing a carbon component into the silicon nitride film can include blocks 112 and 114. In block 112, the substrate can be exposed to a precursor comprising silicon and carbon. In block 114, the substrate can be exposed to a nitrogen precursor. In some embodiments, SiCN sub-cycle 114 can be repeated a number of times. In some embodiments, block 112 or block 114 can be repeated a number of times before performing one or more times the other block. For example, block 112 can be repeated a number of times before performing block 114.

In some embodiments excess nitrogen precursor is removed prior to repeating the SiCN sub-cycle 110. In some embodiments, excess precursor comprising the silicon and carbon from block 112 can be removed prior to exposing the substrate to the nitrogen precursor in block 114. In some embodiments, the SiCN sub-cycle 110 is an ALD process. In some embodiments, the pulses of the precursor comprising silicon and carbon and of the nitrogen precursor may at least partially overlap. In some embodiments, no additional precursors are provided to the reaction chamber either between blocks 112 and 114, or before starting blocks 112 and 114.

In some embodiments, a silicon carbon nitride film formed according to process 100 described herein is a not a nanolaminate film. For example, distinct and separate layers within the deposited SiCN film are not visible, such that the SiCN film is a continuous or substantially continuous film.

A variety of silicon precursors may be suitable. In some embodiments, a suitable silicon precursor in a process for depositing a silicon nitride film can include at least one of silicon halides, silicon alkylamines, silicon amines and/or silanes (e.g., including silanes comprising one or more alkyl groups). For example, a suitable silicon precursor can include a silicon chloride. In some embodiments, a silicon precursor can include a halosilane. In some embodiments, a silicon precursor can include an alkyl silicon compound comprising a halide. In some embodiments, a silicon precursor can be alkyl silane. In some embodiments, a silicon precursor can include octachlorotrisilane ($Si_3Cl_8$, OCTS). In some embodiments, a silicon precursor can include hexachlorodisilane ($Si_2Cl_6$, HCDS).

Suitable nitrogen precursors for a SiN sub-cycle can include a variety of nitrogen-containing reactants. In some embodiments, a nitrogen precursor can include a hydrogen bonded to a nitrogen (N—H). In some embodiments, a suitable nitrogen precursor can be ammonia ($NH_3$). In some embodiments, a suitable nitrogen precursor can be hydrazine ($N_2H_4$). In some embodiments, a suitable nitrogen precursor can comprise one or more reactive species generated by a nitrogen-containing plasma. In some embodiments, a suitable nitrogen precursor can comprise one or more reactive species generated by a hydrogen-containing plasma. For example, a suitable nitrogen precursor can include nitrogen-containing radicals, hydrogen-containing radicals, nitrogen atoms, hydrogen atoms and/or combinations thereof.

Suitable precursors comprising silicon and carbon for a SiCN sub-cycle can include silylalkane. In some embodiments, a precursor comprising silicon and carbon can include bis(trichlorosilyl)methane (BTCSMe), 1,2-bis (trichlorosilyl)ethane (BTCSEt), and/or a combination thereof. In some embodiments, a precursor comprising silicon and carbon has a —Si—R—Si— group, where R can be $C_1$-$C_8$ hydrocarbon, such as $C_1$-$C_3$ alkyl chain. In some embodiments, a precursor comprising silicon and carbon is a halogen substituted silylalkane, preferably the halogen is chloride. In some embodiments, a precursor comprising silicon and carbon has at least two silicon atoms which are connected to each other through carbon and/or hydrocarbon. In some embodiments, a precursor comprising silicon and carbon is an unsubstituted silylalkane, such as bis(silyl) alkane, tris(silyl)alkane and/or tetrakis(silyl)alkane. In some embodiments, a precursor comprising silicon and carbon is a substituted silylalkane, such as bis(halosilyl)alkane, tris (halosilyl)alkane and/or tetrakis(halosilyl)alkane. In some embodiments, a silyl group of the silylalkane can be substituted with substituents other than halogens (e.g., substituted with an alkyl group).

Suitable nitrogen precursors for a SiCN sub-cycle can include a reactant having a hydrogen bonded to a nitrogen (N—H), such as ammonia ($NH_3$). In some embodiments, a suitable nitrogen precursor can be hydrazine ($N_2H_4$). In some embodiments, a suitable nitrogen precursor can comprise one or more reactive species generated by a nitrogen-containing plasma. In some embodiments, a suitable nitrogen precursor can comprise one or more reactive species generated by a hydrogen-containing plasma. For example, a suitable nitrogen precursor can include nitrogen-containing radicals, hydrogen-containing radicals, nitrogen atoms, hydrogen atoms and/or combinations thereof. A SiCN sub-cycle nitrogen precursor may be the same as or different a SiN sub-cycle nitrogen precursor. For example, both a nitrogen precursor for the SiCN sub-cycle and a nitrogen precursor for the SiN sub-cycle may include ammonia.

In some embodiments, the substrate on which deposition is desired, such as a semiconductor workpiece, is loaded into a reactor. The reactor may be part of a cluster tool in which a variety of different processes in the formation of an integrated circuit are carried out. In some embodiments, one or more deposition processes described herein can be performed in a batch reactor, including for example in a mini-batch reactor (e.g., a reactor having a capacity of eight substrates or less) and/or a furnace batch reactor (e.g., a reactor having a capacitor of fifty or more substrates). In some embodiments, one or more deposition processes described herein can be performed in a single wafer reactor. In some embodiments, a reactor having a cross-flow configuration can be suitable (e.g., a reactor chamber configured to provide gas flow parallel or substantially parallel to a substrate surface positioned in the reactor chamber). In some embodiments, a reactor having a showerhead configuration can be suitable (e.g., a reactor configured to provide gas flow perpendicular or substantially perpendicular to a substrate surface positioned in the reactor).

Exemplary single wafer reactors are commercially available from ASM America, Inc. (Phoenix, Ariz.) under the tradenames Pulsar® 2000 and Pulsar® 3000 and ASM Japan K.K (Tokyo, Japan) under the tradename Eagle® XP and XP8. Exemplary batch ALD reactors are commercially available from and ASM Europe B.V (Almere, Netherlands) under the tradenames A400™ and A412™.

A reaction chamber within which a SiCN deposition processes is performed may be purged and/or evacuated between precursor pulses, for example to remove excess reactants and/or reaction byproducts from the reaction chamber. The flow rate and time of each precursor, is tunable, as is the purge and/or evacuation step, allowing for control of the film composition.

According to some embodiments of the present disclosure, the pressure of the reaction chamber during processing is maintained at about 0.01 Torr to about 50 Torr, preferably from about 0.1 Torr to about 10 Torr.

A thermal ALD process for a SiN deposition sub-cycle can include a silicon precursor comprising octachlorotrisilane ($Si_3Cl_8$, OCTS) and/or hexachlorodisilane ($Si_2Cl_6$, HCDS), and a nitrogen precursor comprising ammonia ($NH_3$). Exposing a substrate to the silicon precursor (e.g., block 104 of FIG. 1) can include exposing the substrate to $Si_3Cl_8$ and/or $Si_2Cl_6$. For example, $Si_3Cl_8$ and/or $Si_2Cl_6$ can be fed into a reaction chamber (e.g., a silicon precursor pulse) for a duration of time sufficient to form up to a monolayer on the substrate surface. Exposing the substrate to the nitrogen precursor in the SiN deposition sub-cycle (e.g., block 108 of FIG. 1) can include exposing the substrate to $NH_3$. For example, $NH_3$ can be fed into the reaction chamber (e.g., a nitrogen precursor pulse) for a duration of time sufficient to react with the adsorbed silicon precursor.

A thermal ALD process for a SiCN deposition sub-cycle can include a precursor comprising silicon and carbon, for example a precursor comprising bis(trichlorosilyl)methane (BTCSMe) and/or 1,2-bis(trichlorosilyl)ethane (BTCSEt), and a nitrogen precursor comprising, for example, ammonia ($NH_3$). Exposing a substrate to the precursor comprising the silicon and carbon (e.g., block 112 of FIG. 1) can include exposing the substrate to BTCSMe and/or BTCSEt. For example, BTCSMe and/or BTCSEt can be fed into a reaction chamber (e.g., a pulse for introducing the precursor comprising the silicon and carbon) for a duration of time sufficient to form up to a monolayer on the substrate surface. Exposing the substrate to the nitrogen precursor of the SiCN deposition sub-cycle (e.g., block 114 of FIG. 1) can include exposing the substrate to $NH_3$. For example, $NH_3$ can be fed into a reaction chamber (e.g., a nitrogen precursor pulse) for a duration of time sufficient to react with the silicon and carbon precursor on the substrate surface.

The pulse length for a silicon precursor pulse (e.g., for a SiN sub-cycle) and/or a nitrogen precursor pulse (e.g., for a SiN sub-cycle and/or a SiCN sub-cycle) can be from about 0.05 seconds to about 5.0 seconds, including about 0.1 seconds to about 3 seconds, and about 0.2 seconds to about 1.0 second. In some embodiments, the pulse length for a silicon precursor can be different from that of a nitrogen precursor of a SiN sub-cycle and/or a nitrogen precursor of a SiCN sub-cycle. In some embodiments, the pulse length for a silicon precursor can be similar to or the same as that of a nitrogen precursor. For example, a nitrogen precursor pulse of a SiN sub-cycle and/or a SiCN sub-cycle, and/or a silicon precursor pulse can be about 1 second. In some embodiments, the pulse length for a precursor comprising silicon and carbon (e.g., for a SiCN sub-cycle) can be about 0.1 seconds to about 1 second, including about 0.2 seconds to about 0.5 seconds. For example, a pulse length for a precursor comprising silicon and carbon can be about 0.25 seconds.

In some embodiments, a precursor pulse for delivering one or more precursors into a reaction chamber in an ALD process can be followed by a removal process, such as for removal of excess precursors and/or reaction byproducts from the vicinity of the substrate surface. The removal process may include evacuating reaction byproducts and/or excess reactants between precursor pulses, for example by drawing a vacuum on the reaction chamber to evacuate excess reactants and/or reaction byproducts. In some embodiments, the removal process includes a purge process. A gas such as nitrogen ($N_2$), argon (Ar) and/or helium (He) can be used as a purge gas to aid in the removal of the excess reactants and/or reaction byproducts.

In some embodiments, a purge pulse following a pulse of the silicon precursor and/or a pulse of the nitrogen precursor (e.g., for a SiN sub-cycle and/or a SiCN sub-cycle) can have a pulse length of about 1 second to about 20 seconds. For example, a purge pulse following a silicon precursor pulse and/or a nitrogen precursor pulse for a SiN sub-cycle and/or a nitrogen precursor pulse for a SiCN sub-cycle can have a pulse length of about 5 seconds. In some embodiments, a purge pulse comprising nitrogen ($N_2$) gas for removing excess reactants and/or byproducts from the reaction chamber after a silicon precursor pulse can have a pulse length of about 5 seconds. In some embodiments, a purge pulse following a pulse of the precursor comprising silicon and carbon can have a pulse length of about 1 second to about 10 seconds. For example, a purge pulse comprising nitrogen (N$_2$) gas following a pulse of the precursor comprising silicon and carbon can have a pulse length of about 3 seconds. For example, a precursor pulse length for exposing a substrate to a silicon precursor in a SiN sub-cycle can be about 1 second, followed by a purge process of about 5 seconds. In some embodiments, a precursor pulse length for exposing the substrate to a nitrogen precursor in a SiN deposition sub-cycle and/or a SiCN deposition sub-cycle can be about 1 second. In some embodiments, the nitrogen precursor pulse in a SiN deposition sub-cycle and/or a SiCN deposition sub-cycle can be followed by a purge process having a duration of about 5 seconds. In some embodiments, a precursor pulse length for exposing the substrate to a silicon precursor comprising silicon and carbon in a SiCN deposition sub-cycle can be about 0.25 seconds. In some embodiments, the precursor comprising silicon and carbon precursor pulse can be followed by a purge process of about 3 seconds.

In some embodiments, a silicon carbon nitride (SiCN) film can be grown at about 450° C., for example in a Pulsar 3000® reactor on 300 mm silicon wafers. The process for growing the silicon carbon nitride (SiCN) film can include SiN sub-cycles and SiCN sub-cycles (e.g., thermal ALD processes). The silicon precursor can comprise octachlorotrisilane (Si$_3$Cl$_8$, OCTS), the nitrogen precursor for both the SiN sub-cycle and the SiCN sub-cycle can comprise ammonia (NH$_3$), and the precursor comprising silicon and carbon can comprise bis(trichlorosilyl)methane (BTCSMe) and/or 1,2-Bis(trichlorosilyl)ethane (BTCSEt). The pulse lengths for OCTS and/or NH$_3$ can be about 1.0 second (s), purge length following an OCTS and/or NH$_3$ pulse can be about 5 seconds, the pulse length of BTCSMe and/or BTCSEt can be about 0.25 s, and purge length can be about 3 s after a BTCSMe and/or BTCSEt pulse.

In some embodiments, precursors, such as OCTS, BTCSMe and/or BTCSEt, can be stored in one or more respective gas bubblers. For example, one or more of the gas bubblers may be maintained at a temperature of about 40° C. Vapor phase precursors, such as OCTS, BTCSMe and/or BTCSEt may be provided to the reactor from the gas bubblers. For example, a mass flow rate of the OCTS, BTCSMe and/or BTCSEt into the reactor may be controlled by the extent to which a flow valve to the reactor is kept open (e.g., extent to which a needle valve is kept open). In some embodiments, a nitrogen precursor can be provided to the reactor from a gas source regulated at a pressure of about 1.5 bar. For example, the mass flow rate of the nitrogen precursor may be determined by the extent to which a flow valve to the reactor is kept open (e.g., extent to which a needle valve is kept open).

Figure 2:
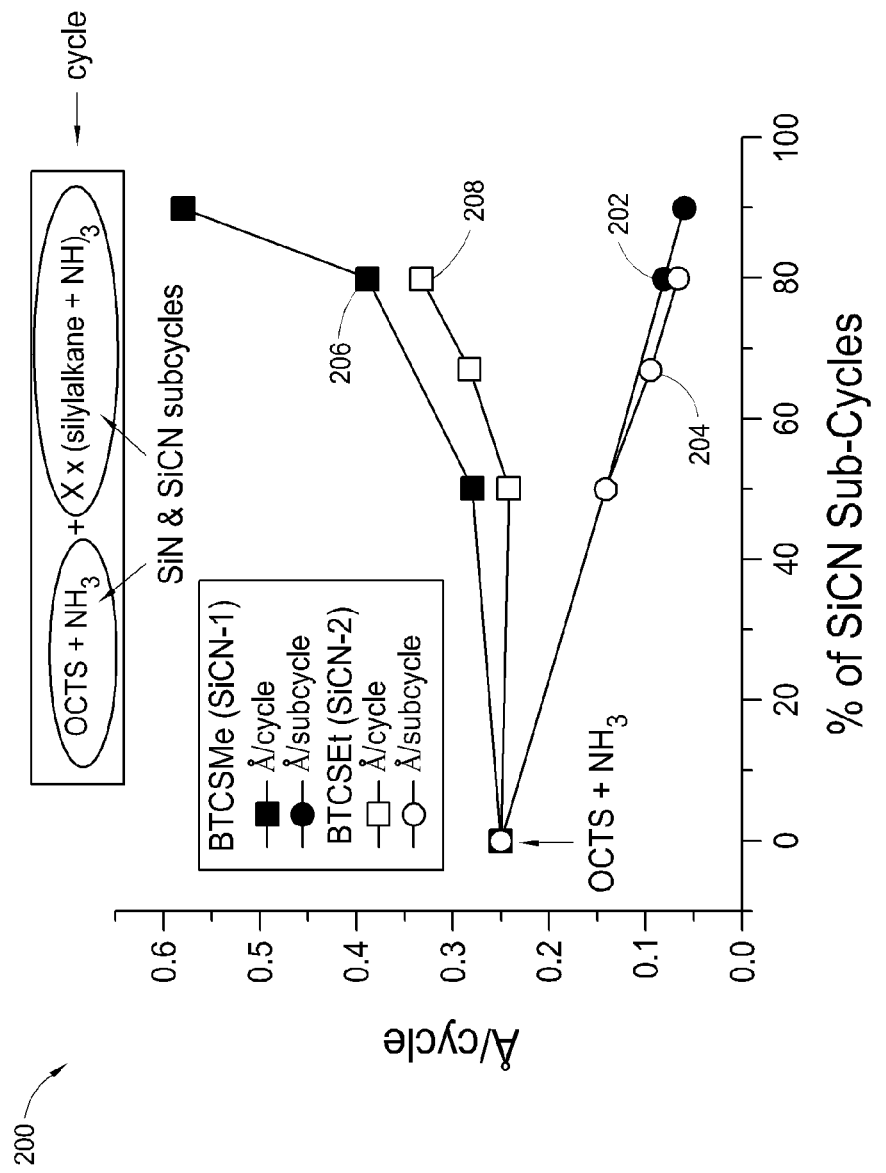
FIG. 2 is a graph showing growth rates for examples of silicon carbon nitride (SiCN) films.

Graph 200 of FIG. 2 includes film growth rate curves which show examples of dependence of growth rates on a SiCN sub-cycle percentage for silicon carbon nitride (SiCN) films, for complete cycles and sub-cycles. In FIG. 2, a film growth rate for each complete cycle or each sub-cycle of a deposition process, measured in angstroms per cycle (Å/cycle), is graphed against a SiCN sub-cycle percentage of the corresponding complete cycle used in forming the film. A complete cycle used in forming the films shown in FIG. 2 included a SiN sub-cycle in which the silicon precursor included octachlorotrisilane (OCTS) and the nitrogen precursor included ammonia. The film growth rate curves 202 and 206 correspond to films deposited using a SiCN sub-cycle in which the precursor comprising silicon and carbon included BTCSMe and the nitrogen precursor included ammonia. The film growth rate curve 202 shows dependence of the film growth rate per SiCN sub-cycle, while film growth rate curve 206 shows dependence of the film growth rate per complete cycle. The film growth rate curves 204 and 208 correspond to films deposited using a SiCN sub-cycle in which the precursor comprising silicon and carbon included BTCSEt and the nitrogen precursor included ammonia. Film growth rate curve 204 shows dependence of the film growth per SiCN sub-cycle, while the film growth rate curve 208 shows dependence of the film growth rate per complete cycle.

The films of FIG. 2 can be formed according to one or more processes described herein. For example, a film formed using a deposition process having a SiCN sub-cycle percentage of about 80% was deposited using a number of complete cycles having one silicon nitride (SiN) deposition sub-cycle (e.g., one SiN sub-cycle) and four silicon carbon nitride (SiCN) deposition sub-cycles (e.g., four SiCN sub-cycles). A complete cycle may include a SiN deposition sub-cycle in which pulsing of a silicon precursor (e.g., OCTS) is followed by a purge process and then pulsing of a nitrogen precursor of the SiN deposition sub-cycle (e.g., ammonia (NH$_3$)) followed by a purge process, the SiN sub-cycle being followed by four SiCN sub-cycles in which each SiCN sub-cycle included pulsing of a precursor comprising silicon and carbon (e.g., BTCSMe for curves 202, 206, and BTCSEt for curves 204 and 208) followed by a purge process and then pulsing of a nitrogen precursor of the SiCN sub-cycle (e.g., ammonia (NH$_3$)) followed by a purge process. The one or more SiN sub-cycles and/or SiCN sub-cycles can comprise an ALD process.

FIG. 2 shows that a growth rate per sub-cycle for each of the SiCN deposition sub-cycles including the precursor comprising silicon and carbon (e.g., an effective growth rate) generally decreases (e.g., decreases linearly) with an increase in the fraction of SiCN sub-cycles in the corresponding complete cycle, or with an increase in the SiCN sub-cycle percentage. FIG. 2 also shows that, advantageously, film growth rate per complete cycle for each of the complete cycles increases with an increase in the fraction of SiCN sub-cycles in the corresponding complete cycle, or with an increase in the SiCN sub-cycle percentage. Without being limited by any particular theory or mode of operation, FIG. 2 may demonstrate that addition of a SiCN sub-cycle facilitates film growth rate of a SiCN film. For example, FIG. 2 shows that with addition of SiCN sub-cycles the film growth rate increased above the film growth rate for a process in which no SiCN sub-cycle was included (e.g., the film growth rate of SiCN films increased above 0.25 Å/cycle, the growth rate of the SiN film). Further without being limited by theory, a deposition process including an ALD process with both SiN sub-cycles and SiCN sub-cycles may provide reactive surface groups to facilitate SiCN film growth. For example, —SiCl$_3$ groups can be reactive towards —NH and/or —NH$_2$ functional groups on a substrate surface, while –NH and/or —NH$_2$ functional groups may not be reactive towards —CH$_2$ surface functional groups, such that no or substantially no reactive surface groups are left for precursors to react after a few cycles of the SiCN sub-cycles, which includes the precursor comprising silicon and carbon. The SiN sub-cycle may thereby facilitate providing reactive surface functional groups for continued SiCN film growth.

FIG. 3 shows a table listing examples of film compositions provided by analysis using X-ray photoelectron spectroscopy (XPS) of silicon carbon nitride (SiCN) films deposited on a substrate using processes as described herein, each film having a thickness as listed in Table 3, expressed in nanometers, nm. A thickness of about 80 angstroms (Å) of SiCN film was sputtered and/or removed from a surface of each of the SiCN films prior to the XPS analysis for determining film bulk compositions. The table shown in FIG. 3 quantifies the amount of carbon atoms (C), nitrogen atoms (N), oxygen atoms (O), and silicon atoms (Si), expressed as an atomic percent, for each of the corresponding SiCN films. The film composition labeled with "SiCN-1" corresponds to a film formed using a SiCN deposition sub-cycle in which the precursor comprising silicon and carbon included BTCSMe. The film composition labeled with "SiCN-2" corresponds to a film formed using a SiCN deposition sub-cycle in which the precursor comprising silicon and carbon included BTCSEt. The table in FIG. 3 shows that carbon was incorporated into the silicon nitride films. The table shows that the SiCN-1 film had a thickness of about 19 nm and contained about 5.2 atomic % C while the SiCN-2 film had a thickness of about 26 nm and contained about 9.9 atomic % C. Analysis of the SiCN-1 and the SiCN-2 films indicated that at least a portion of the carbon atoms (C) in the films was bonded to a silicon atom (Si). For example, most of the C in the SiCN-1 and the SiCN-2 films was bonded to a Si atom, such as about 80% of the C in the SiCN-1 and the SiCN-2 films were bonded to a Si atom. In some embodiments, all or substantially all of the C in a SiCN film is bonded to a Si atom. In some embodiments, about 50% to about 100% of the C atoms are bonded to a Si atom, and in some embodiments about 70% to about 90% of the C atoms are bonded to a Si atom.

In some embodiments, a SiCN film can have a C content of about 1 atomic % to about 30 atomic %, preferably about 2 atomic % to about 20 atomic %. For example, a SiCN film can have a C content of about 5 atomic % to about 15 atomic %.

Analysis of the SiCN-1 and the SiCN-2 films also indicated that the films contained a significant quantity of oxygen atoms (O). For example, concentration of O in the SiCN-1 and/or SiCN-2 film increased towards a surface of the film. Without being limited by theory, the O content of the films may be due, at least in part, to post-deposition oxidation of the films.

The SiCN films listed in the table of FIG. 3 can be deposited using one or more processes as described herein, including for example one or more process described with reference to FIG. 2. For example, each of the listed SiCN films was formed using a deposition process including a number of complete cycles, each complete cycle including one silicon nitride (SiN) deposition sub-cycle and four SiCN deposition sub-cycles (e.g., the complete cycle having a SiCN sub-cycle percentage of 80%). The SiN deposition sub-cycle for both the SiCN-1 film and the SiCN-2 film included a silicon precursor comprising OCTS and a nitrogen precursor comprising ammonia. The SiCN deposition sub-cycles for both the SiCN-1 film and the SiCN-2 film included a nitrogen precursor comprising ammonia. The SiCN-1 film was deposited using about 500 complete cycles. The SiCN-2 film was deposited using about 750 complete cycles.

As shown in FIG. 3, one or more deposition process parameters can be selected to control a carbon (C) content of a silicon carbon nitride (SiCN) film. For example, a C content of a SiCN film may depend on the selected precursor comprising silicon and carbon and/or the number of complete deposition cycles used in forming the film. In some embodiments, a process parameter for controlling a C content of the SiCN film can include, for example, a number of SiCN deposition sub-cycles for each complete cycle of the deposition process, and/or a pulse duration of the precursor pulse for the precursor comprising silicon and carbon).

In some embodiments, a SiCN film deposited on a substrate can demonstrate a film non-uniformity (e.g., a 1-sigma non-uniformity) of about 5% to about 10%.

Figure 4:
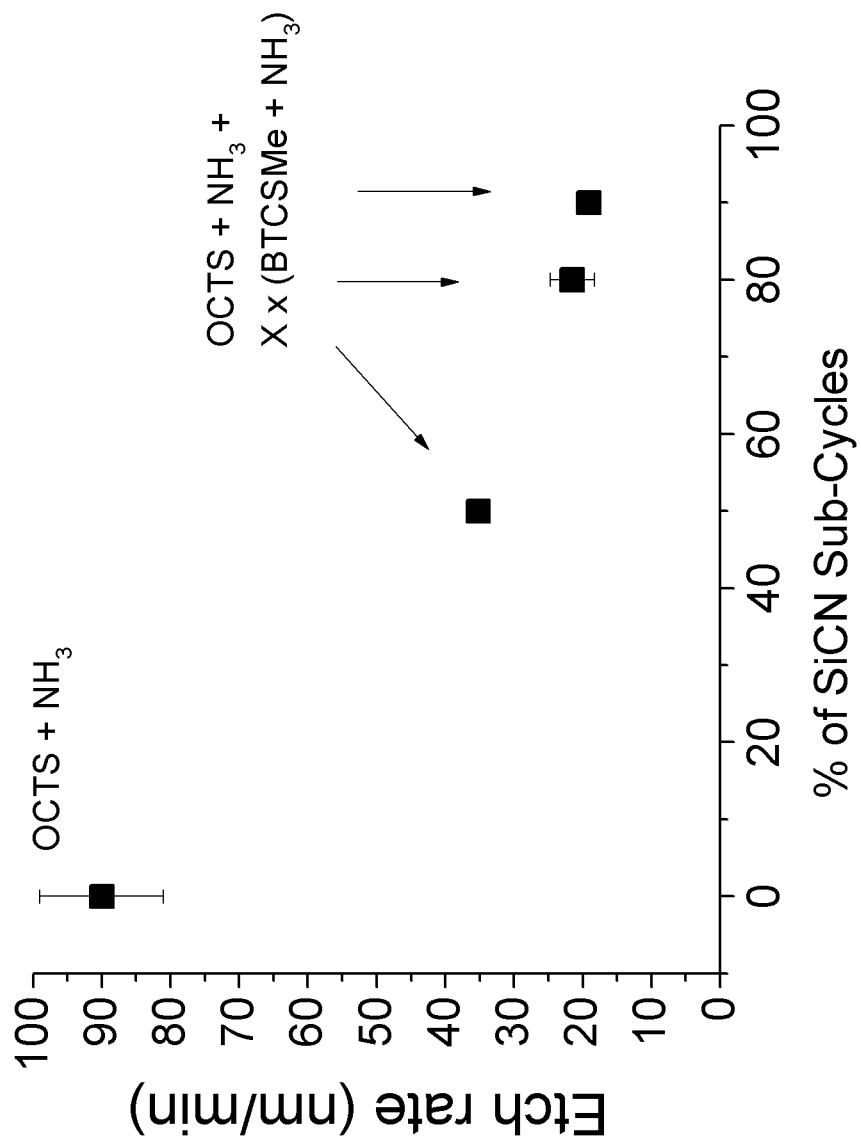
FIG. 4 is a graph showing etch rate performance of examples of silicon carbon nitride (SiCN) films.

FIG. 4 shows examples of wet etch rate performances, in aqueous hydrofluoric (HF) acid solution (e.g., aqueous HF solution have a concentration of about 0.5 weight %, or dHF), of a silicon nitride (SiN) film and silicon carbon nitride (SiCN) films formed using deposition processes having SiCN sub-cycle percentages of about 50%, about 80% and about 90%. The etch rate performance is expressed in nanometers per minute (nm/min). The SiN film was formed using a number of deposition cycles in which the substrate was alternately and sequentially contacted with a silicon precursor comprising OCTS and a nitrogen precursor comprising ammonia ($NH_3$). The SiCN films can be formed using one or more deposition processes as described herein, including for example one or more deposition processes as described with reference to FIG. 2. For example, the SiCN film deposition process included a number of complete cycles, where each complete cycle included a SiN sub-cycle and a number of SiCN sub-cycles, such that each complete cycle had the desired SiCN sub-cycle percentage (e.g., about 50%, about 80% and about 90%). FIG. 4 shows examples of etch rate performances of SiCN films deposited using SiCN sub-cycles having BTCSMe as the precursor comprising silicon and carbon, and ammonia as the nitrogen precursor.

FIG. 4, shows that addition of carbon into a silicon nitride film can facilitate reduction in a wet etch rate of the film. The silicon carbon nitride (SiCN) films demonstrated a lower wet etch rate than the silicon nitride film. For example, the silicon nitride (SiN) film demonstrated an etch rate of about 90 nanometers per minute (nm/min) in the aqueous HF solution, while the SiCN film deposited using a process having a SiCN sub-cycle percentage of about 90% demonstrated an etch rate of about 19 nm/min. A significant reduction in etch rate, for example as compared to a SiN film, can also be observed in the SiCN film deposited using a process having a SiCN sub-cycle percentage of about 50%. For example, the SiCN film deposited using a process having a SiCN sub-cycle percentage of about 50% demonstrated an etch rate of about 35 nm/min, as compared to an etch rate of about 90 nm/min demonstrated by the SiN film.

Additionally, as shown in FIG. 4, wet etch rate in the aqueous HF solution of the SiCN films deposited using BTCSMe decreased as the SiCN sub-cycle percentages increased. For example, the SiCN film deposited with the SiCN sub-cycle percentage of about 50% demonstrated a wet etch rate of about 35 nm/min, while the SiCN film deposited with the SiCN sub-cycle percentage of about 90% demonstrated a wet etch rate of about 19 nm/min.

In some embodiments, a SiCN film deposited using a SiCN sub-cycle which includes BTCSEt as the precursor comprising silicon and carbon can demonstrate etch rates in dilute aqueous HF acid solution (e.g., aqueous HF acid solution having a concentration of about 0.5 weight %) similar to that of SiCN films deposited using BTCSMe as the precursor comprising silicon and carbon. For example, an etch rate of a SiCN film deposited using a deposition process having a SiCN sub-cycle percentage of about 80% and BTCSEt as the precursor comprising silicon and carbon can have an etch rate in dilute aqueous HF acid solution of about 21 nanometers/min (nm/min), demonstrating significant reduction in etch rate as compared to a SiN film.

In some embodiments, a silicon nitride (SiN) film can have an etch rate in a dilute aqueous hydrofluoric acid solution (e.g., a concentration of about 0.5 weight %, or dHF) of about 80 nanometers per minute (nm/min) to about 100 nm/min. In some embodiments, a silicon carbon nitride (SiCN) film formed by a deposition process having a SiCN sub-cycle percentage of about 50% can have an etch rate in dHF of about 30 nm/min to about 40 nm/min. In some embodiments, a SiCN film formed by a deposition process having a SiCN sub-cycle percentage of about 80% can have an etch rate in dHF of about 18 nm/min to about 25 nm/min. In some embodiments, a SiCN film formed by a deposition process having a SiCN sub-cycle percentage of about 90% can have an etch rate in dHF of about 17 nm/min to about 21 nm/min.

Plasma Treatment Process

As described herein, a silicon carbon nitride (SiCN) deposition process (e.g., a thermal ALD process as described herein) can be combined with a plasma treatment process. For example, the plasma treatment process can be applied to a SiCN film deposited using thermal ALD deposition processes. The combination of the SiCN deposition process and the post film deposition plasma treatment process can facilitate formation of a SiCN film having desirable characteristics, including for example, SiCN films having desired wet etch rate, wet etch selectivity relative to thermally formed silicon oxide (TOX) while maintaining desired conformal film deposition on three-dimensional structures having high aspect ratios (e.g., aspect ratios of about 6 or higher). SiCN films having such desirable characteristics may be particularly suitable for spacer applications in semiconductor device fabrication.

In some embodiments, a wet etch rate (WER), in dHF, of a SiCN film treated by a plasma treatment process can be less than about 50% than that of thermal oxide film (e.g., thermally grown silicon oxide, TOX), including about 20% to about 30% that of TOX in dHF. For example, wet etch rates, in dHF, of SiCN films treated by a plasma treatment process can be less than about 5 nanometers per minute (nm/min), preferably less than about 4 nm/min, more preferably less than about 2 nm/min, and most preferably less than about 1 nm/min.

In some embodiments, a SiCN film treated by a plasma treatment process can be formed on a three-dimensional structure having sidewall and top regions (e.g., trench structures) such that a ratio of a wet etch rate, in dHF, of the SiCN film on a sidewall to a wet etch rate of the SiCN film on a top region is less than about 4, including less than about 3. In some embodiments, the ratio of the wet etch rate of the SiCN film on the sidewall to that of the SiCN film on the top region in dHF can be about 1.

Figure 5:
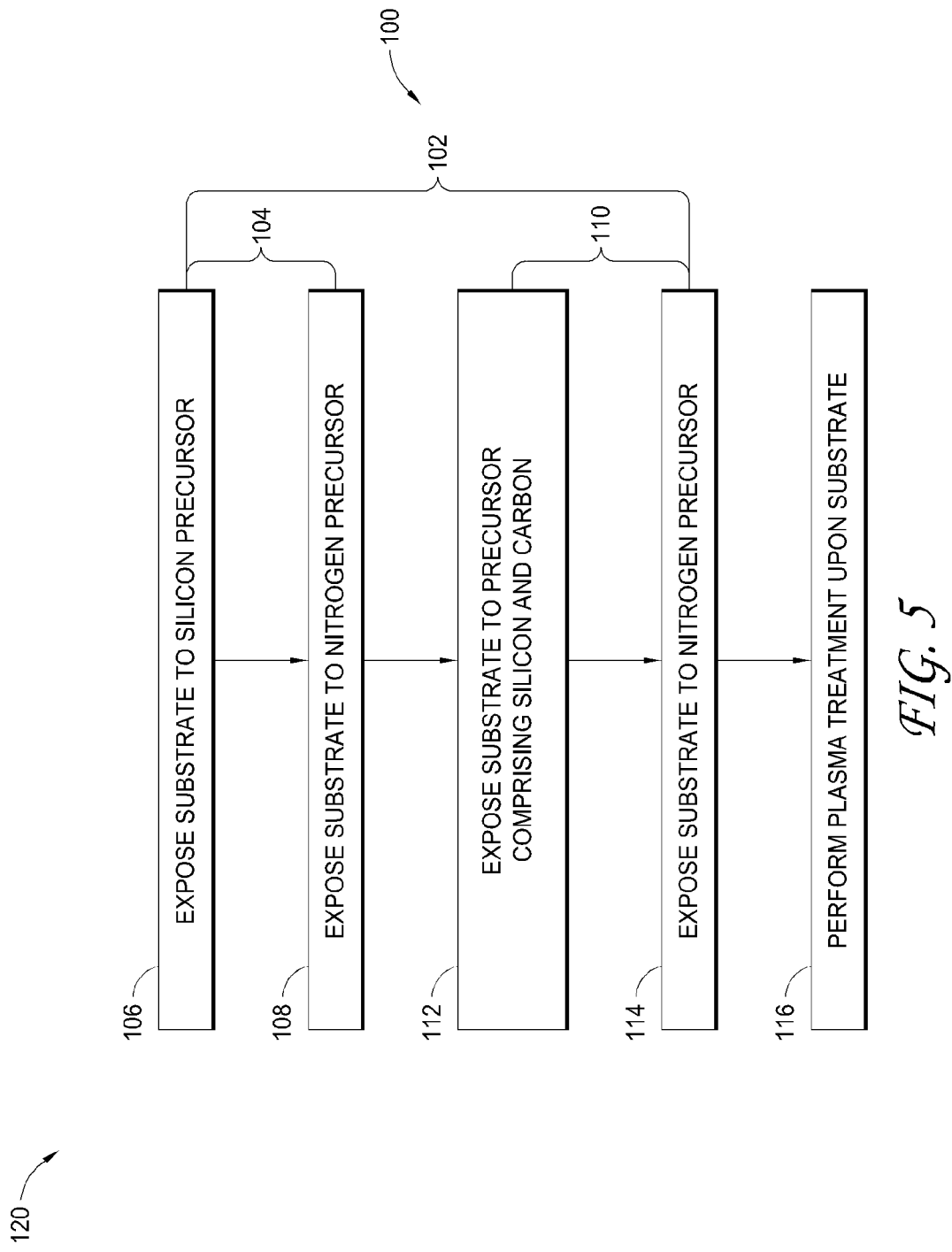
FIG. 5 shows an example of another process for forming a silicon carbon nitride material on a substrate.

FIG. 5 shows a flow chart of an example of a process 120 for forming a silicon carbon nitride film (e.g., a SiCN film), which includes the process 100 described with reference to FIG. 1 in combination with a plasma treatment process 116. For example, the process 100 (e.g., a thermal ALD process) can be followed by the plasma treatment process 116 so as to provide a SiCN film having desirable characteristics. In some embodiments, the number of times the plasma treatment process 116 is repeated can be selected to provide the SiCN film having desirable characteristics. For example, a number of repetitions of the process 100 can be followed by a number of repetitions of the plasma treatment process 116. In some embodiments, a film formation process can include repetitions of a process comprising a number of cycles of the process 100 followed by a number of cycles of the plasma treatment process 116 (e.g., a process including two repetitions can include a number of cycles of the process 100, followed by a number of cycles of the plasma treatment 116, followed by a number of cycles of the process 100, and followed by a number of cycles of the plasma treatment process 116).

A silicon carbon nitride film formed according to process 120 may not be a nanolaminate film. For example, separate and distinct layers may not be visible within the silicon nitride film such that a continuous or substantially continuous film without or substantially without any film interface layer within the film can be formed.

In some embodiments, a plasma treatment reactor could be a part of a multi-reactor processing system, such as a cluster tool. For example, the plasma treatment reactor may be a part of the same cluster tool as a reactor used for depositing the SiCN film. For example, a batch reactor used for thermal ALD deposition of the SiCN film may be a part of the same cluster tool as the reactor used for the plasma treatment process such that a substrate having the SiCN film deposited thereon can be transferred to the plasma treatment reactor without or substantially without being exposed to ambient air, facilitating increased throughput. In some other embodiments, the plasma treatment reactor may be a stand-alone reactor and it not part of a multi-reactor processing system.

Plasma treatments can be performed in a variety of processing environments, including for example in a showerhead PEALD reactor. In some embodiments, one or more plasma treatment processes described herein can be performed in a 300 mm showerhead plasma enhanced atomic layer deposition (PEALD) reactor (e.g., GENI MP-3000MD RC2, commercially available from ASM Genitech Korea Ltd. of Cheonan-si, Korea). In some embodiments, the plasma treatment can be performed at a susceptor temperature of about 350° C. to about 450° C. For example, the plasma treatment can be performed at a susceptor temperature of about 400° C.

In some embodiments, the plasma treatment can be performed at a pressure of about 1 Torr to about 3 Torr. For example, the plasma treatment can be performed at a pressure of about 2 Torr (e.g., the plasma treatment can be performed while the reactor chamber is maintained at a pressure of about 2 Torr).

In some embodiments, the plasma treatment process can include a direct plasma, and/or a remote plasma. A plasma for the plasma treatment may be generated by applying RF power of from about 10 Watts (W) to about 2000 W, preferably from about 50 W to about 1000 W, more preferably from about 100 W to about 500 W. In some embodiments, the RF power density may be from about 0.02 Watts per square centimeter (W/cm$^2$) to about 2.0 W/cm$^2$, preferably from about 0.05 W/cm$^2$ to about 1.5 W/cm$^2$. The RF power may be applied to one or more plasma treatment process reactant gases provided to the reactor and/or to a remote plasma generator. Thus in some embodiments the plasma is generated in situ, while in other embodiments the plasma is generated remotely.

A plasma treatment process can include a number of cycles, where one or more cycles can include a sequence in which the plasma is powered on for a first duration of time and a second duration of time in which the plasma is turned off. For example, each cycle of the plasma treatment can include a first duration of time in which the plasma is turned on, follow by a second duration of time in which plasma is turned off.

In some embodiments, one or more plasma treatment process reactant gases continue to be supplied to the reactor chamber during the duration of time in which the plasma is turned off. For example, one or more plasma treatment process reactant gases can be continuously supplied to the reactor chamber during the treatment process, both during the time in which the plasma is turned on and during the time in which the plasma is turned off. In some embodiments, the plasma for the plasma treatment process can be generated in the one or more reactant gases being flowed through the reactor chamber. For example, the flow of the one or more reactant gases can be continued while the plasma power is turned on to generate the plasma in the reactant gases, and flow of one or more of the reactant gases can be continued also during the interval in which the plasma power is turned off. In some embodiments, not all reactant gases flowed through the reactor chamber for generating the plasma when the plasma power is on is flowed through the reactor chamber during the interval (e.g., when the plasma power is off).

The plasma treatment process can include a number of cycles such that a deposited film can be exposed to the plasma for a duration of time to provide a film having desired characteristics. The duration of time a deposited film is exposed to the plasma treatment can depend on a number of parameters, including parameters relating to the deposited film (e.g., a film thickness of the deposited film having the desired characteristics, such as increased resistance to wet etchant dHF), and/or parameters relating to a three-dimensional (3-D) structure upon which the film is deposited (e.g., a shape, dimension, and/or aspect ratio of the 3-D structure).

In some embodiments, the plasma treatment can have a duration of at least about 30 seconds (s), preferably at least about 1 minute (min), and more preferably at least about 2 min. For example, subjecting a deposited film to a total 10 minute plasma treatment can be performed using 10 cycles in which each cycle includes 60 seconds during which the plasma is turned on followed by 30 seconds during which plasma is turned off (e.g., a sequence including 10×(60 seconds plasma on+30 seconds plasma off)). Including a period of time in one or more cycles of the plasma treatment in which the plasma is off may facilitate reduction in the overheating of the plasma power source.

In some embodiments, a plasma treatment process can follow one or more complete cycles of a process for depositing a silicon carbon nitride (SiCN) film (e.g., a complete cycle including a SiN deposition sub-cycle and a number of SiCN deposition sub-cycles). For example, a process for forming a plasma treated SiCN film can include repetition of the following process: a number of complete cycles of a process for depositing the SiCN film followed by a number of cycles of the plasma treatment process. In some embodiments, a plasma treatment process can follow a number of SiCN deposition sub-cycles and/or a SiN deposition sub-cycle. For example, one or more plasma treatment processes may be performed after one or more SiN deposition sub-cycles, and/or one or more SiCN deposition sub-cycles. In some embodiments, one or more plasma treatment processes can be performed after each SiN deposition sub-cycle and/or each SiCN deposition sub-cycle. In some embodiments, a process for providing a plasma treated SiCN film can include repetition of the following process: one or more SiCN deposition sub-cycles followed by one or more cycles of the plasma treatment. In some embodiments, a process for providing a plasma treated SiCN film can include repetition of the following process: a SiN deposition sub-cycle, followed by repetition of a process including one or more SiCN deposition sub-cycles followed by one or more cycles of the plasma treatment. In some embodiments, a process for providing a plasma treated SiCN film can include repetition of the following process: one or more SiN deposition sub-cycles followed by one or more cycles of the plasma treatment, followed by one or more SiCN deposition sub-cycles.

In some embodiments, suitable reactant gas for a plasma treatment process can include nitrogen gas ($N_2$), hydrogen gas ($H_2$) and/or argon (Ar). Various reactant flow rates can be suitable. In some embodiments, flow rate of reactant gases can be selected so as to maintain a desired reactor chamber pressure during the plasma treatment process (e.g., one or more reactant gases having a flow rate to maintain a reactor chamber pressure of about 2 Torr). A flow rate for each of $N_2$, $H_2$ and/or Ar can be about 20 standard cubic centimeters per minute (sccm) to about 2000 sccm, preferably from about 50 sccm to 1000 sccm. In some embodiments, the flow rate of each of $N_2$ and/or $H_2$ can be about 20 sccm to about 1000 sccm. For example, a flow rate for each of $N_2$, and/or $H_2$ can be about 50 sccm. For example, a flow rate for Ar can be about 600 sccm.

The duration in which plasma is turned on in a cycle of a plasma treatment process may or may not be the same as the duration in which plasma is turned on in one or more other cycles of the plasma treatment process. Other process parameters of a cycle in a plasma treatment process, including for example, susceptor temperature, reactor chamber pressure, and/or reactant gas flow rate, may or may not be the same as that of one or more other cycles of the plasma treatment process. In some embodiments, the plasma treatment process can include a number of repetitions of cycles in which each cycle includes the same or substantially the same process parameters as other cycles of the plasma treatment process.

In some embodiments, reactant gases are purified prior to being introduced into the reactor. Purification of reactant gases can be performed using a variety of suitable commercially available inert gas purifier (e.g., Gatekeeper® Gas Purifier available from Entegris, Inc. of Billerica, Mass.).

In some embodiments, the reaction chamber in which plasma treatment process is performed can undergo a cleaning procedure prior to initiating the plasma treatment process, such as prior to beginning a first cycle of the plasma treatment process. In some embodiments, the cleaning procedure can be performed between two cycles of the plasma treatment process. A reaction chamber cleaning procedure can include applying a plasma power of about 500 Watts (W) to about 700 W, such as about 600 W and supplying a reaction chamber clean reactant gas (e.g., argon (Ar)) for a suitable duration of time. Various durations can be suitable for the cleaning procedure, including for example from about 1 minute to about 5 minutes. In some embodiments, the cleaning procedure can be performed for about 2 minutes. For example, a reaction chamber clean procedure can include providing an Ar gas flow into the reaction chamber, with a plasma power of about 600 Watts (W), for a duration of about 2 minutes. In some embodiments, a flow rate for Ar in the chamber clean process can be about 600 sccm. Other Ar flow rates may also be suitable.

Figure 6:
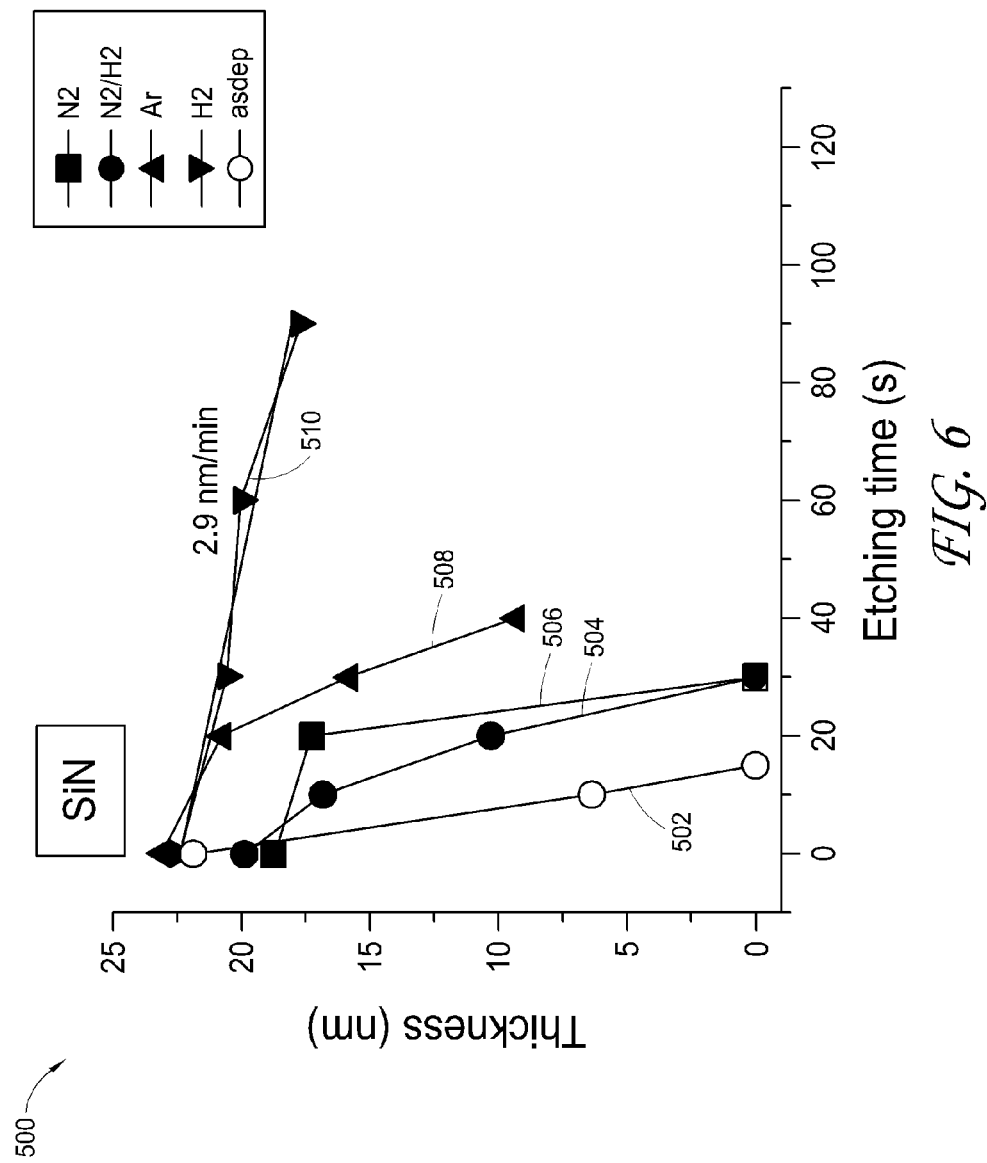
FIG. 6 is a graph showing changes in thickness of silicon nitride (SiN) films when exposed to a wet etchant, where the SiN films have been subjected to different plasma treatment processes.

As described herein, application of a plasma treatment process as described herein to a silicon nitride based film may facilitate reduction in the wet etch rate of the film. FIG. 6 shows a graph 500 of film thickness curves showing changes in film thicknesses, expressed in nanometers (nm), of silicon nitride (SiN) films exposed to a wet etchant (e.g., aqueous hydrofluoric acid solution having a concentration of about 0.5 weight %, or dHF) as a function of the duration of exposure to the wet etchant, expressed in seconds (s). Film thickness curve 502 graphs the change in thickness of a SiN film which has not undergone a post film deposition plasma treatment process. Film thickness curves 504, 506, 508 and 510 graph changes in thicknesses of SiN films which had undergone post deposition plasma treatment processes. Film thickness curve 504 graphs the change in thickness of a SiN film which had undergone a plasma treatment process comprising reactant gases nitrogen gas ($N_2$), hydrogen gas ($H_2$), and argon (Ar). Film thickness curve 506 graphs the change in thickness of a SiN film which had undergone a plasma treatment process comprising reactant gases $N_2$ and Ar. Film thickness curve 508 graphs the change in thickness of a SiN film which had undergone a plasma treatment process comprising reactant gas Ar, and film thickness curve 510 graphs the change in thickness of a SiN film which had undergone a plasma treatment process comprising reactant gases $H_2$ and Ar. The plasma treatment processes were performed using a plasma power of about 200 Watts (W), at a reaction chamber pressure of about 2 Torr and a susceptor temperature of about 400° C., and each treatment providing a number of cycles to expose the SiN films to plasma for a total duration of about 10 minutes. Each cycle of the plasma treatment process included about 60 seconds during which the plasma power was kept on followed by 30 seconds during which plasma power was turned off. The cycle was repeated 10 times such that the SiN films were exposed to plasma for the total of about 10 minutes. The flow rates of $N_2$ and $H_2$ were about 50 standard cubic centimeters per minute (sccm). The flow rate of Ar can be selected, for example, to achieve a desired reaction chamber pressure during the plasma treatment process. In some embodiments, a flow rate for Ar can be about 600 sccm.

FIG. 6 shows improved etch resistance of the SiN film against dilute aqueous hydrofluoric acid solution (e.g., dHF) with application of a post SiN film deposition plasma treatment. As compared to the SiN film which did not undergo plasma treatment subsequent to the film deposition, each of the SiN films which had undergone subsequent plasma treatment, films corresponding to film thickness curves 504, 506, 508 and 510, showed reduced rate of decrease in film thickness when exposed to dHF. Referring to FIG. 6, of the graphed examples of plasma treatment processes, film thickness curve 510 shows that the SiN film which underwent a plasma treatment process using reactant gases $H_2$ and Ar demonstrated the most resistance against etching by dHF. For example, a linear fit of the graphed data points of film thickness curve 510 shows a wet etch rate of about 2.9 nanometers per minute (nm/min) for the SiN film which was subjected to the plasma treatment process including reactant gases hydrogen ($H_2$) and argon (Ar), demonstrating an etch rate comparable to that of thermally formed silicon oxide (TOX) in dHF (e.g., TOX can have an etch rate in dHF of about 2.0 nm/min to about 2.5 nm/min).

Figure 7:
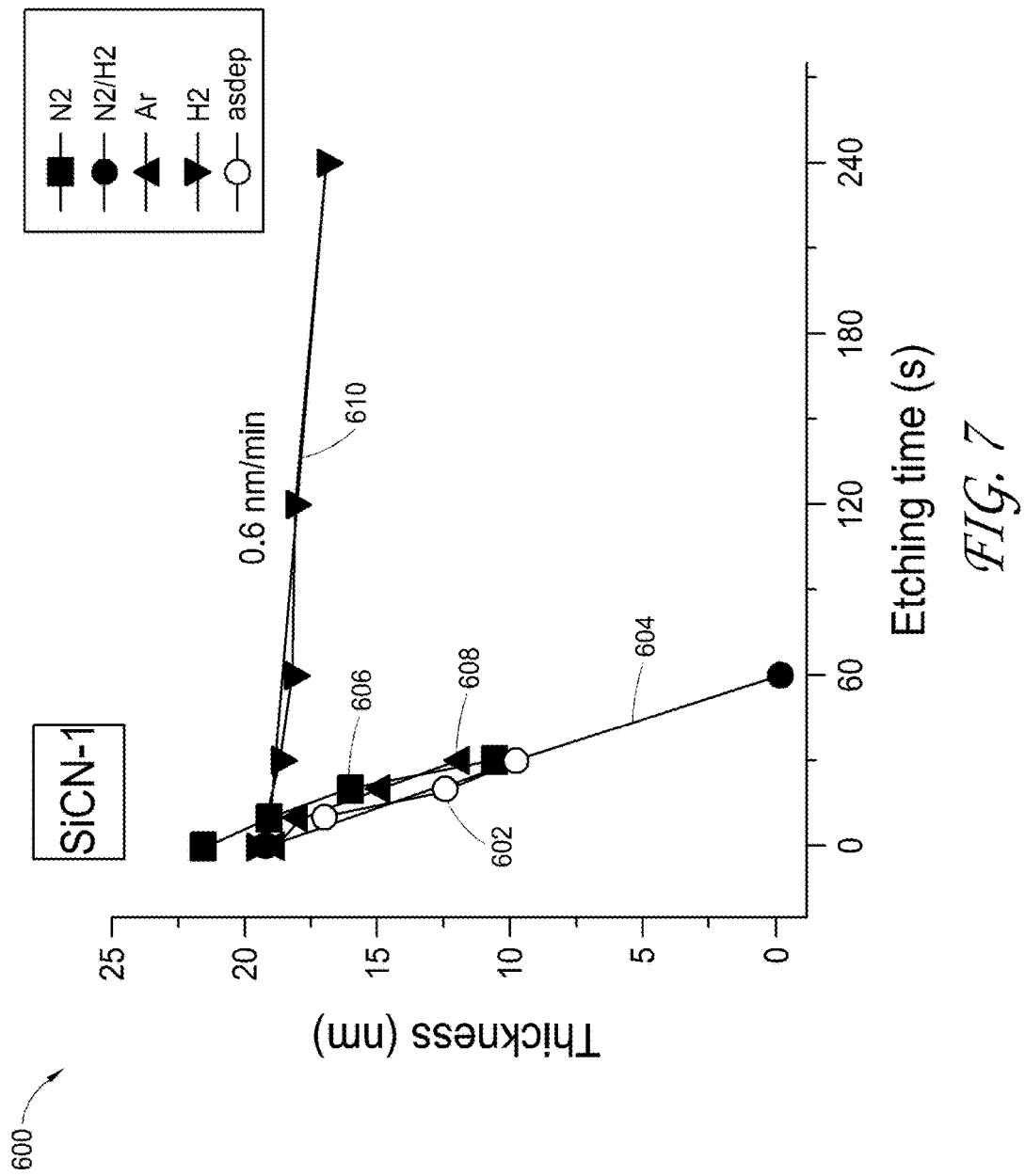
FIG. 7 is a graph showing changes in thickness of silicon carbon nitride (SiCN) films when exposed to a wet etchant, where the SiCN films have been subjected to different plasma treatment processes.

FIG. 7 is a graph 600 film thickness curves showing changes in film thicknesses, expressed in nanometers (nm), of silicon carbon nitride (SiCN) films, as a function of duration of exposure to a wet etchant (e.g., aqueous hydrofluoric acid solution having a concentration of about 0.5 weight %, or dHF), expressed in seconds (s). Film thickness curve 602 graphs the change in thickness of a SiCN film which has not undergone a post SiCN film deposition plasma treatment process. Film thickness curve 604 graphs the change in thickness of a SiCN film which has undergone a post SiCN film deposition plasma treatment process comprising reactant gases nitrogen ($N_2$), hydrogen ($H_2$), and argon (Ar). Film thickness curve 606 graphs the change in thickness of a SiCN film which has undergone a post SiCN film deposition plasma treatment process comprising reactant gases $N_2$ and Ar. Film thickness curve 608 graphs the change in thickness of a SiCN film which has undergone a post SiCN film deposition plasma treatment process comprising reactant gas Ar, and film thickness curve 610 graphs the change in thickness of a SiCN film which has undergone a post SiCN film deposition plasma treatment process comprising reactant gases $H_2$ and Ar.

The SiCN films were formed according to one or more processes described with reference to FIG. 2. For example, the SiCN films of FIG. 7 were formed using a deposition process which includes a SiCN sub-cycle percentage of about 80% and BTCSMe as the precursor comprising silicon and carbon. The plasma treatment processes can include the various process parameters as described herein. For example, the plasma treatment processes were performed using a plasma power of about 200 Watts (W), at a reactor chamber pressure of about 2 Torr and a susceptor temperature of about 400° C., and each treatment providing a number of cycles to expose the SiCN films to plasma for a total duration of about 10 minutes (e.g., 10 cycles, where each cycle included 60 seconds of plasma power on followed by 30 seconds of plasma power off). The plasma treatment process was performed after performing a number of complete cycles for depositing the SiCN film. The flow rates of $N_2$ and $H_2$ were about 50 standard cubic centimeters per minute (sccm). In some embodiments, a flow rate for Ar can be about 600 sccm. In some embodiments, the flow rate of Ar can be selected, for example, to achieve a desired reactor chamber pressure during the plasma treatment process.

FIG. 7 shows that of the graphed silicon carbon nitride (SiCN) films, the etch resistance of the SiCN film treated with a plasma treatment process using reactant gases hydrogen ($H_2$) and argon (Ar) demonstrated significant improvement. For example, a linear fit of the graphed data points of film thickness curve 610 shows that the SiCN film subjected to a plasma treatment process using $H_2$ and Ar demonstrated an etch rate of about 0.6 nanometers per minute (nm/min), an even lower etch rate in dHF than the SiN film treated with the plasma treatment process using $H_2$ and Ar described herein with reference to FIG. 6 (e.g., the SiN film corresponding to film thickness curve 510 as described herein with reference to FIG. 6).

Figure 8:
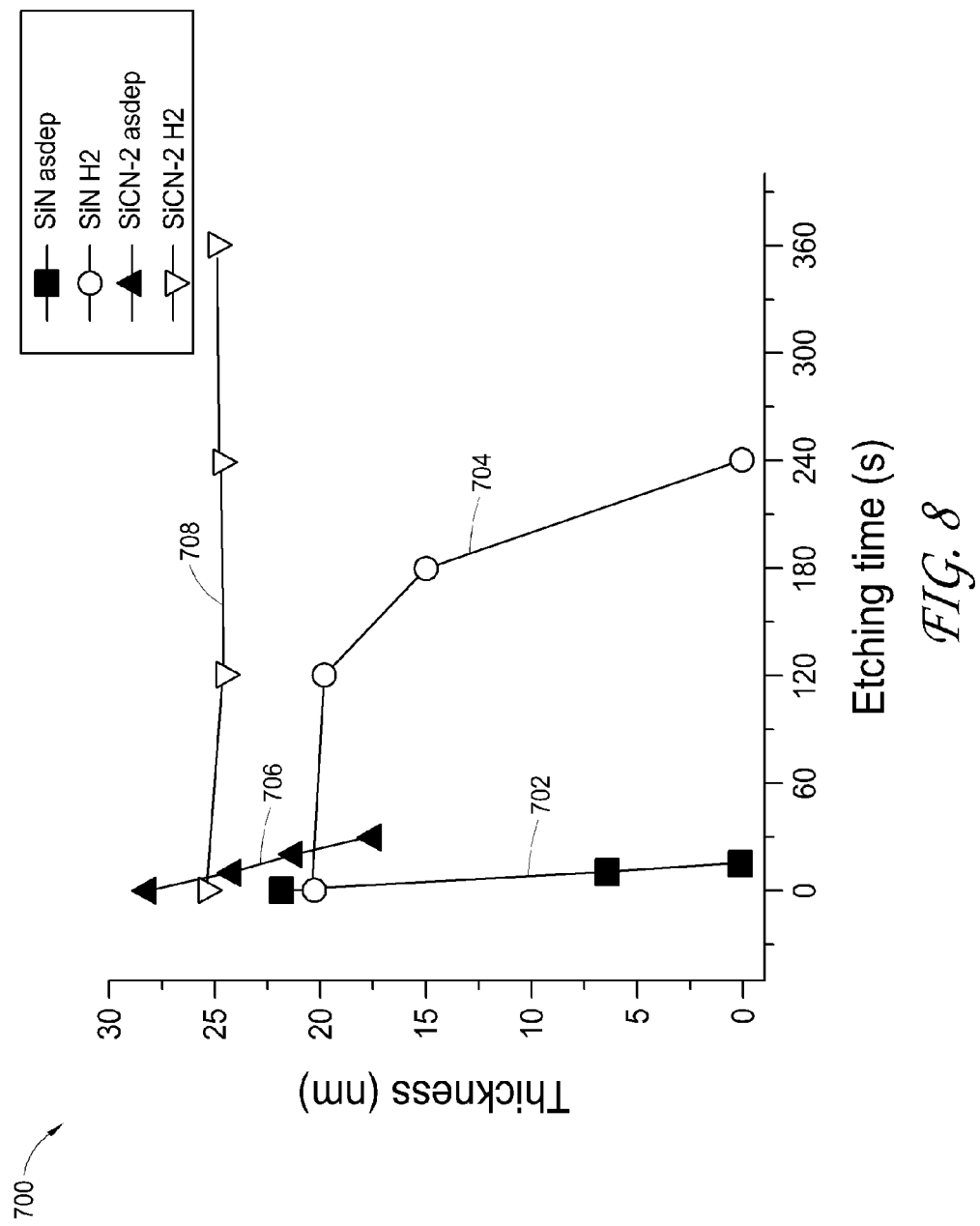
FIG. 8 is a graph showing changes in thickness of silicon carbon nitride (SiCN) and silicon nitride (SiN) films when exposed to a wet etchant, where the SiCN and SiN films have been subjected to a plasma treatment process.

FIG. 8 is a graph 700 of film thickness curves showing changes in film thicknesses, expressed in nanometers (nm), of silicon nitride (SiN) films and silicon carbon nitride (SiCN) films, as a function of duration of exposure to a wet etchant (e.g., aqueous hydrofluoric acid solution having a concentration of about 0.5 weight %, or dHF), expressed in seconds (s). Film thickness curve 702 graphs the change in thickness of a SiN film was had not undergone a plasma treatment subsequent to SiN film deposition. Film thickness curve 704 graphs the change in thickness of a SiN film which had undergone a plasma treatment process comprising reactant gases nitrogen hydrogen ($H_2$) and argon (Ar). Film thickness curve 706 graphs the change in thickness of a SiCN film which had not undergone a post film deposition plasma treatment process, while film thickness curve 708 graphs the change in thickness of a SiCN film which had undergone a plasma treatment process comprising reactant gases $H_2$ and Ar. The SiCN films can be formed according to one or more processes described herein. For example, the SiCN films were formed using a deposition process described with reference to FIG. 2, using a SiCN sub-cycle percentage of about 80% and BTCSEt as the precursor comprising silicon and carbon. The plasma treatment processes can include the various process parameters as described herein. For example, the plasma treatment processes can be performed using a plasma power of about 200 Watts (W), at a reactor chamber pressure of about 2 Torr and a susceptor temperature of about 400° C., and each treatment providing a number of cycles to expose the SiCN films to plasma for a total duration of about 30 minutes. For example, a plasma treatment process comprising 30 cycles was performed, where each cycle included 60 seconds of plasma on followed by 30 seconds of plasma off. The plasma treatment process can be performed after performing a number of complete cycles for depositing a SiCN film. The flow rate of $H_2$ was about 50 standard cubic centimeters per minute (sccm). The flow rate of Ar was about 600 sccm.

FIG. 8 shows that the silicon nitride (SiN) film and silicon carbon nitride (SiCN) film can demonstrate significantly increased resistance to the wet etchant (e.g., dHF) after undergoing plasma treatment processes comprising reactant gases hydrogen ($H_2$) and argon (Ar), for example as compared to a SiN film and/or a SiCN film which was not subjected to a post film deposition plasma treatment process. Film thickness curve 702 shows that a SiN film not treated by a plasma treatment process can be completely or substantially completely removed after being exposed to the dHF for about 15 seconds. Meanwhile, film thickness curve 704 shows that a SiN film which underwent a plasma treatment process can demonstrate a significantly reduced etch rate when exposed to dHF for at least about 2 minutes before etch rate of the SiN film increases. FIG. 8 shows that the SiN film of film thickness curve 704 was not completely or substantially completely etched until being exposed to dHF for at least about 240 seconds. FIG. 8 additionally shows that the SiCN film corresponding to film thickness curve 708, which was treated with a plasma treatment process using reactant gases comprising $H_2$ and Ar, can be resistant or substantially resistant to removal by dHF during the exposure to the dHF etchant for at least about 6 minutes.

Figure 9:
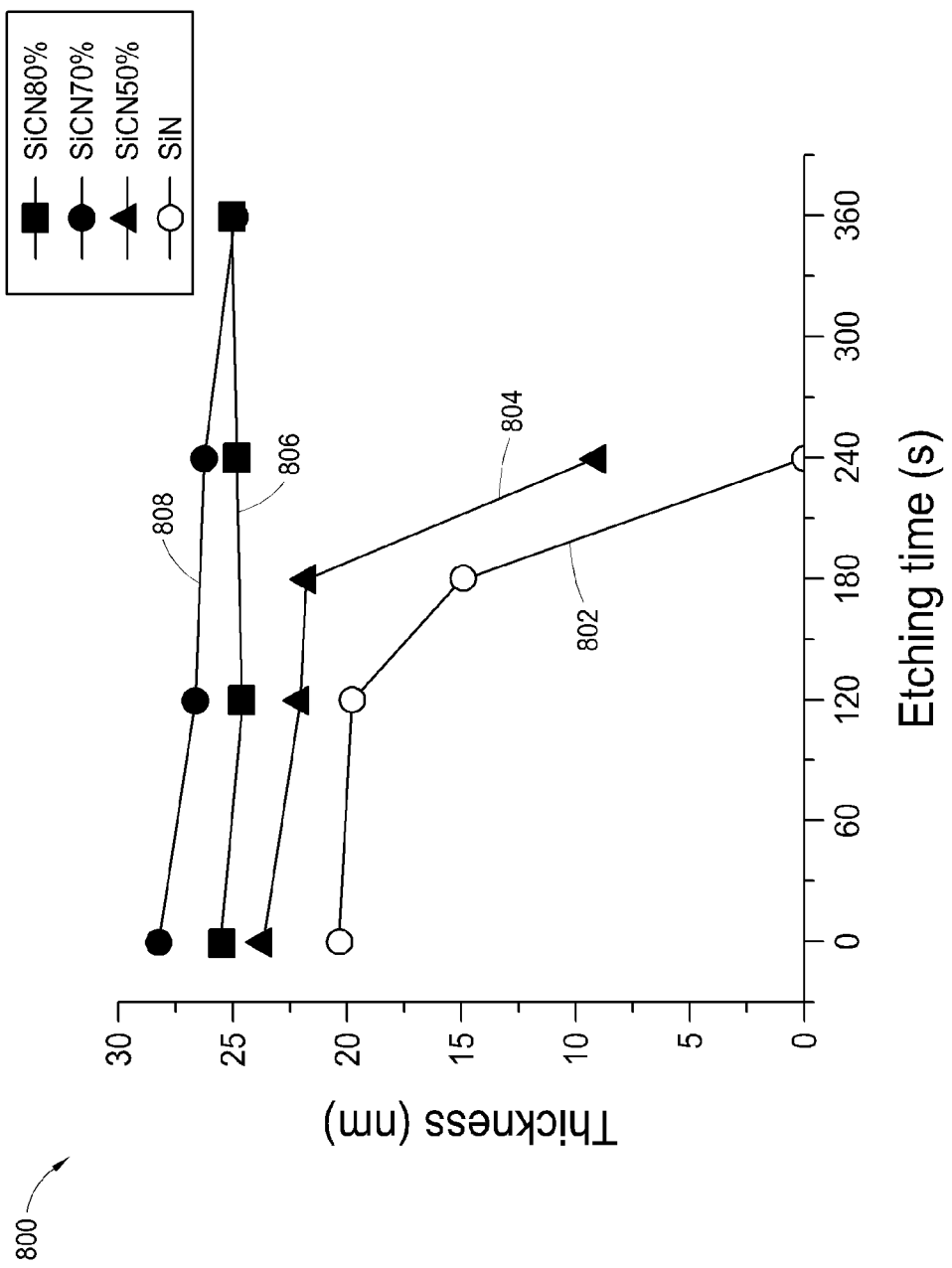
FIG. 9 is a graph showing changes in thickness of silicon carbon nitride (SiCN) films when exposed to a wet etchant, where the SiCN films have been subjected to a plasma treatment process.

FIG. 9 shows a graph 800 of film thickness curves showing changes in film thicknesses, expressed in nanometers (nm), of silicon carbon nitride (SiCN) films deposited using various SiCN deposition sub-cycle percentages, as a function of duration of exposure to a wet etchant (e.g., aqueous hydrofluoric acid solution having a concentration of about 0.5 weight %, or dHF), expressed in seconds (s). FIG. 9 also includes a film thickness curve for a SiN film. The films of FIG. 9 were exposed to a plasma treatment processes including reactant gases hydrogen ($H_2$) and argon (Ar). Film thickness curve 802 graphs the change in thickness of the SiN film. Film thickness curve 804 graphs the change in thickness of a SiCN film formed using a deposition process having a SiCN sub-cycle percentage of about 50%. Film thickness curve 806 graphs the change in thickness of a SiCN film formed using a deposition process having a SiCN sub-cycle percentage of about 70%. Film thickness curve 808 graphs the change in thickness of a SiCN film formed using a deposition process having a SiCN sub-cycle percentage of about 80%. The SiCN film can be formed according to one or more processes described herein, such as the deposition process described with reference to FIG. 2. For example, the SiCN films were formed using BTCSEt as the precursor comprising silicon and carbon. The plasma treatment processes can include the various process parameters as described herein. For example, the plasma treatment processes were performed using a plasma power of about 200 Watts (W), at a reactor chamber pressure of about 2 Torr and a susceptor temperature of about 400° C., and each treatment providing a number of cycles to expose the SiCN films to plasma for a total duration of about 30 minutes (e.g., 30 cycles, where each cycle included 60 seconds of plasma on followed by 30 seconds of plasma off). In some embodiments, a plasma treated SiCN film can include performing the plasma treatment process after performing a number of complete cycles for depositing a SiCN film. The flow rate of $H_2$ was about 50 standard cubic centimeters per minute (sccm). The flow rate of Ar was about 600 sccm.

The graph of FIG. 9 shows that a resistance against removal by the wet etchant (e.g., dHF) generally increases with increasing SiCN sub-cycle percentage used in the deposition process of the SiCN film. Without being limited by theory, an increase in carbon content of the SiCN film, such as through use of increased SiCN deposition sub-cycle percentage in the SiCN film deposition process, may facilitate increased resistance against removal by dHF.

In some embodiments, a SiCN film formed according to one or more processes as described herein can demonstrate a "skinning effect," in which a first portion of the SiCN film provides increased resistance to the wet etchant (e.g., dHF), and after the breaching of this first portion of the SiCN film, resistance to the wet etchant decreases significantly and the wet etch rate increases (e.g., a wet etch rate of the SiCN film corresponding to film thickness curve 804 of FIG. 9 shows increased etch rate in the dHF after being exposed to the dHF for about 190 seconds, for example at which point the first portion of the SiCN film having increased resistance to dHF is breached).

In some embodiments, a process for forming a SiCN film layer for a spacer application can include one or more complete cycles of one or more suitable deposition processes as described herein and/or a one or more number of cycles of one or more suitable plasma treatment processes as described herein, so as to provide a desired thickness of the first portion of the film having the increased resistance to the wet etchant. For example, a process for forming a SiCN film layer for a spacer application can include more than one complete cycles of one or more suitable deposition processes and more than one cycle of one or more suitable plasma treatment processes. For example, a 10 nanometers (nm) thick SiCN film which demonstrates desired resistance to the wet etchant can be formed by repeating three times a process which can provide about a 3 nm thick film having the desired wet etchant resistance (e.g., for use in various semiconductor device applications, including in spacer applications). In some embodiments, the post deposition plasma treatment cycles can be repeated to achieve a desired thickness in the deposited film which can exhibit the desired resistance to wet etch.

Figures 10A, 10B:
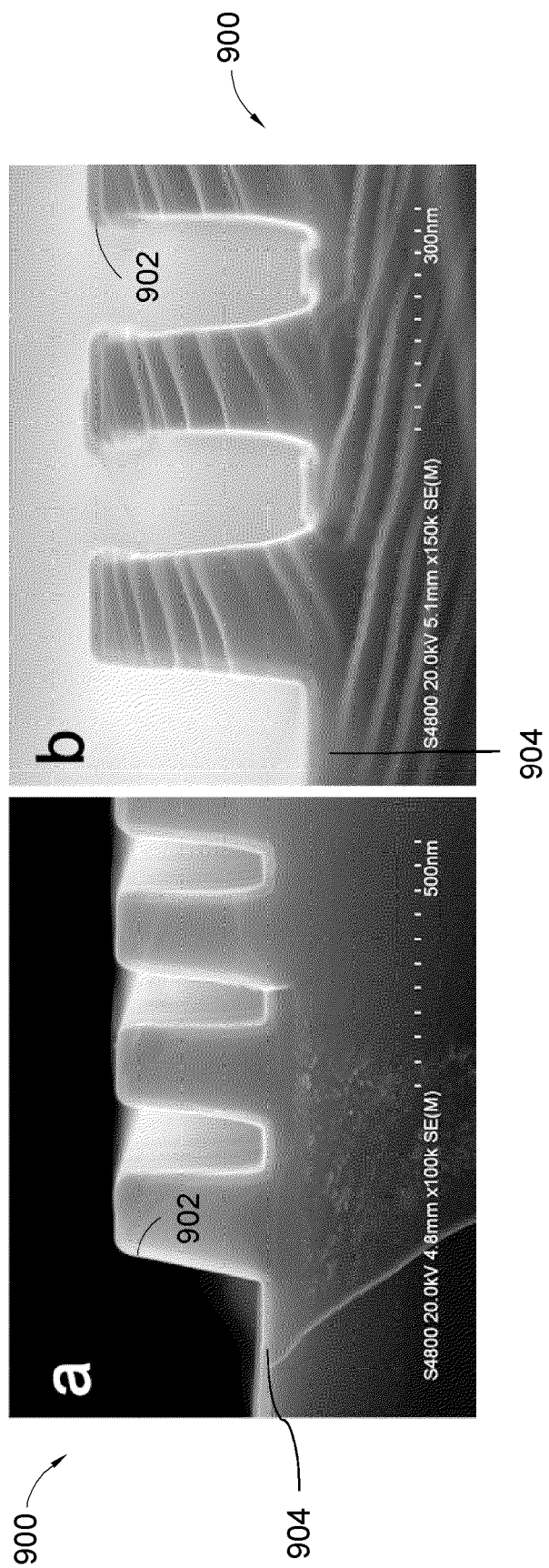
FIGS. 10A and 10B are field emission scanning electron microscopy (FESEM) image of a cross-section view of trench structures coated by a silicon nitride (SiN) film before and after being exposed to a wet etchant.

FIG. 10A shows a field emission scanning electron microscopy (FESEM) image of a cross-section of an example of trench structures 900 having a silicon nitride (SiN) film 902 deposited upon the trench structures 900, and the SiN film 902 deposited on adjacent open area 904. The SiN film 902 had undergone post film deposition plasma treatment, the plasma treatment using reactant gases comprising hydrogen ($H_2$) and argon (Ar). The plasma treatment process can have one or more of the process parameters as described herein. For example, the plasma treatment processes included a duration of about 30 minutes in which plasma was turned on, performed using a plasma power of about 200 Watts (W), at a reactor chamber pressure of about 2 Torr and a susceptor temperature of about 400° C., with the flow rate of $H_2$ at about 50 standard cubic centimeters per minute (sccm) and the flow rate of Ar selected, for example, to achieve the reactor chamber pressure of about 2 Torr during the plasma treatment process (e.g., at about 600 sccm).

FIG. 10B shows a field emission scanning electron microscopy (FESEM) image of a cross-section of the trench structures 900 having the deposited silicon nitride (SiN) film 902, after the SiN film was exposed to a wet etchant (e.g., aqueous hydrofluoric acid having a concentration of about 0.5 weight %, or dHF) for about 2 minutes. FIG. 10B shows that while the SiN film 902 demonstrated desired conformality to the underlying trench structures 900 both before and after being exposed to dHF, portions of the SiN film 902 were removed after exposure to dHF. Portions of the SiN film 902 were removed from vertical sidewalls of the trench structures 900, while the SiN film 902 remained or substantially remained on top surfaces between individual trenches of the trench structure 900, and the adjacent open area 904. Such a performance after being exposed to dHF can be similar to that of a SiN film deposited using a plasma enhanced atomic layer deposition (PEALD) process.

Figures 11A, 11B:
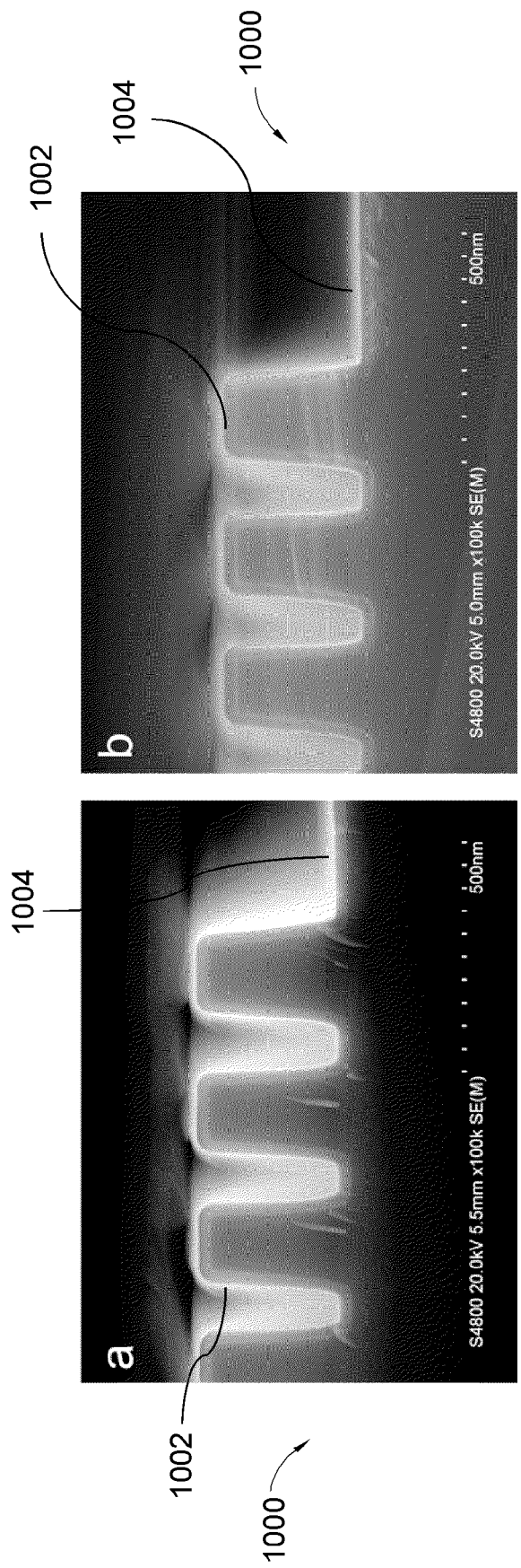
FIGS. 11A and 11B are field emission scanning electron microscopy (FESEM) image of a cross-section view of trench structures coated by a silicon carbon nitride (SiCN) film before and after being exposed to a wet etchant.

FIG. 11A shows a field emission scanning electron microscopy (FESEM) image of a cross-section of an example of a trench structures 1000 having a silicon carbon nitride (SiCN) film 1002 deposited upon trench structures 1000, and the SiCN film 1002 deposited on adjacent open area 1004. The SiCN film 1002 had undergone post film deposition plasma treatment, the plasma treatment using reactant gases comprising hydrogen ($H_2$) and argon (Ar). As shown in FIG. 11A, the SiCN film 1002 comprises a continuous or substantially continuous film in which distinct and separate layers are not visible.

The plasma treatment process can have one or more of the process parameters as described herein. For example, the plasma treatment processes had a duration of about 30 minutes in which plasma was turned on, was performed using a plasma power of about 200 Watts (W), at a reactor chamber pressure of about 2 Torr and a susceptor temperature of about 400° C., with the flow rate of $H_2$ at about 50 standard cubic centimeters per minute (sccm) and the flow rate of Ar selected, for example, to achieve the reactor chamber pressure of about 2 Torr during the plasma treatment process (e.g., at about 600 sccm). The SiCN film can be formed according to one or more processes as described herein, for example using a deposition process having a SiCN sub-cycle percentage of about 80% and BTCSEt as the precursor comprising silicon and carbon. The plasma treatment process (e.g., a number of cycles of the treatment process) for providing the plasma treated SiCN film 1002 was performed after performing a number of complete cycles for depositing a SiCN film.

FIG. 11B shows a field emission scanning electron microscopy (FESEM) image of a cross-section of the trench structures 1000 having the silicon carbon nitride (SiCN) film 1002 deposited upon the trench structures 1000 and the adjacent open area 1004, after the SiCN film 1002 was exposed to a wet etchant (e.g., aqueous hydrofluoric acid having a concentration of about 0.5 weight %, or dHF) for about 2 minutes. FIG. 11B shows that the SiCN film 1002 demonstrated desired conformality to the underlying trench structures 1000 both before and after being exposed to dHF. After exposure to dHF, the SiCN film 1002 desirably remained or substantially remained on all surfaces of the trench structures 1000, including vertical sidewalls of individual trenches. FIG. 11B shows that a plasma treated SiCN film deposited on a three-dimensional (3-D) structure (e.g., trench structures) can be effective in resisting removal from surfaces of the 3-D structure when exposed to dHF for at least a duration of about 2 minutes, including SiCN film on surfaces both between and within the 3-D structures, such as SiCN film on sidewalls within the trench structures.

Measurements of film thickness taken of the SiCN film 1002 on surfaces of the trench structures 1000 before and after being exposed to the dHF demonstrated that the SiCN film 1002 had an etch rate of less than about 1 nanometers per minute (nm/min). As described herein, thermally formed oxide (TOX) can have a wet etch rate in dHF of about 2.0 nm/min to 2.5 nm/min. The SiCN film 1002 desirably demonstrated an etch rate ratio relative to the etch rate of TOX of less than about 0.5. A SiCN film demonstrating such a reduced etch rate in wet etchant, such as dHF, can advantageously facilitate use of silicon nitride based materials in spacer applications.

Figure 12:
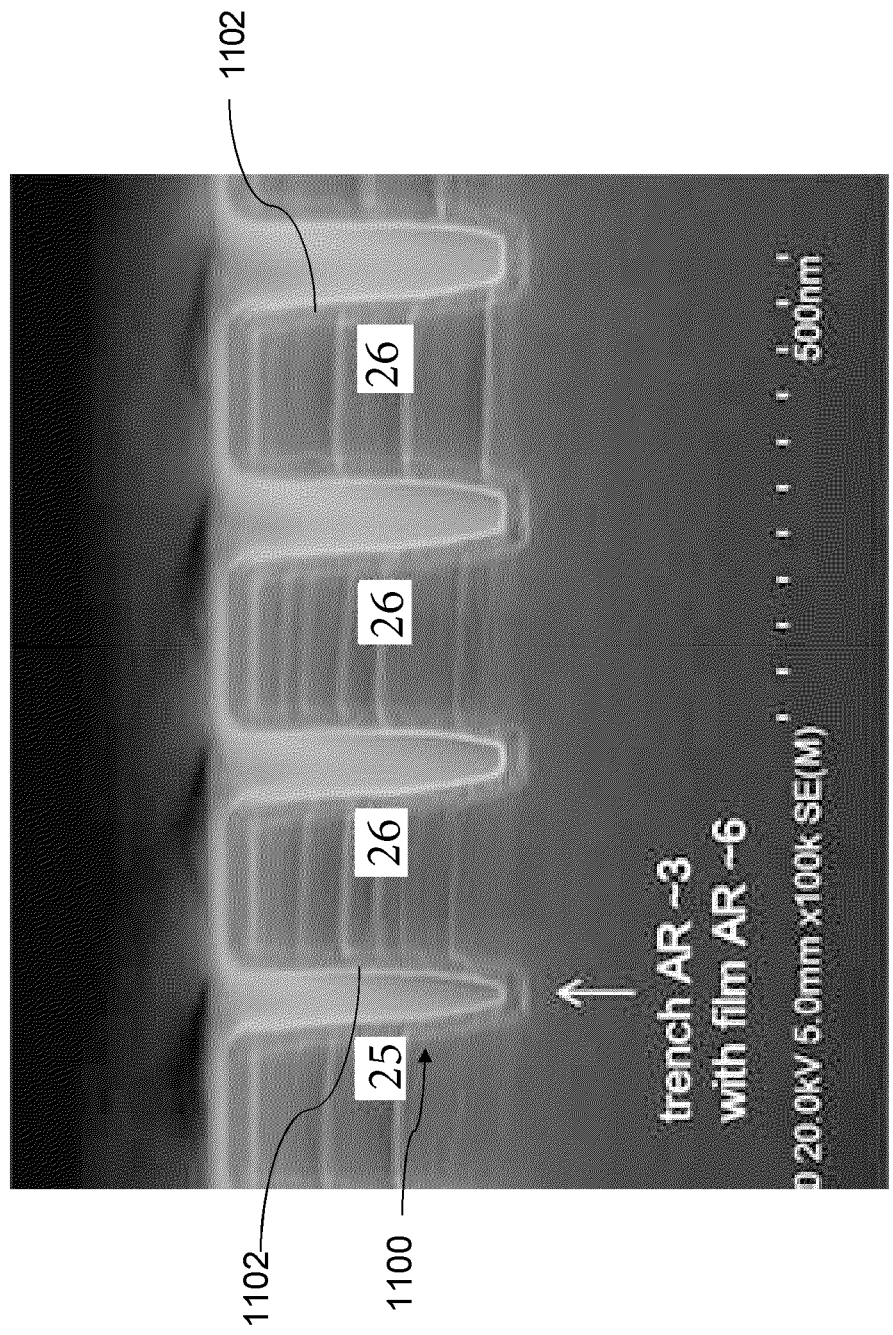
FIG. 12 is a field emission scanning electron microscopy (FESEM) image of a cross-section view of trench structures coated by a silicon carbon nitride (SiCN) film after being exposed to a wet etchant.

FIG. 12 shows a field emission scanning electron microscopy (FESEM) image of a cross-section of an example of a trench structures 1100 having a silicon carbon nitride (SiCN) film 1102 deposited upon the trench structures 1100, after the SiCN film 1102 was exposed to a wet etchant (e.g., aqueous hydrofluoric acid having a concentration of about 0.5 weight %, or dHF) for about 2 minutes. The trench structures 1100 have a high aspect ratio (e.g., an aspect ratio of about 6 or more when including the SiCN film 1102, and an aspect ratio of about 3 or more when not including the SiCN film 1102). The SiCN film 1102 had undergone post film deposition plasma treatment, the plasma treatment using reactant gases comprising hydrogen ($H_2$) and argon (Ar). As shown in FIG. 12, the SiCN film 1102 comprises a continuous or substantially continuous film in which distinct and separate layers are not visible.

The plasma treatment process of FIG. 12 can have one or more of the process parameters as described herein. For example, the plasma treatment processes had a duration of about 30 minutes in which plasma was turned on, performed using a plasma power of about 200 Watts (W), at a reactor chamber pressure of about 2 Torr and a susceptor temperature of about 400° C., with the flow rate of $H_2$ at about 50 standard cubic centimeters per minute (sccm), and the flow rate of Ar selected, for example, to achieve the reactor chamber pressure of about 2 Torr during the plasma treatment process. The SiCN film can be formed according to one or more processes as described herein, for example using a deposition process having a SiCN sub-cycle percentage of about 80% and a BTCSEt as the precursor comprising silicon and carbon. The plasma treatment process for providing the plasma treated SiCN film 1102 can be performed after performing a number of complete cycles for depositing a SiCN film.

FIG. 12 shows that the SiCN film 1102 demonstrated excellent conformality to the underlying trench structures 1100, and a thickness of about 26 nanometers (nm) remains on vertical sidewalls of individual trenches of the trench structures 1100. For example, typically PEALD processes for forming a silicon nitride based film layer cannot achieve desired conformality to underlying three-dimensional (3-D) features.

In some embodiments, a SiCN film's resistance against removal from within a 3-D structure can be similar to that from an open area. In some embodiments, the SiCN film's resistance against removal from within a 3-D structure can be similar to or the same as that of a SiCN film deposited on a blanket wafer. For example, SiCN film deposited on a blanket wafer can demonstrate a remaining film thickness of about 26 nm after being exposed to dHF for about 2 minutes, similar to or the same as the SiCN film 1102 remaining on vertical sidewalls of individual trenches of the trench structures 1100 shown in FIG. 12.

FIGS. 13 and 14 include tables providing additional X-ray photoelectron spectroscopy (XPS) analysis of various SiCN films formed according to one or more processes as described herein. For example, the "SiCN-1" films as listed in the tables of FIGS. 13 and 14 were formed using BCTSMe as the precursor comprising silicon and carbon and a process having a SiCN sub-cycle percentage of about 80%. The "SiCN-2" films as listed in the tables of FIGS. 13 and 14 were formed using BTCSEt as the precursor comprising silicon and carbon and a process having a SiCN sub-cycle percentage of about 80%. The SiCN-1 and SiCN-2 films labeled as being subjected to a plasma treatment process were subjected to a plasma process using reactant gases comprising hydrogen ($H_2$) and argon (Ar). For example, the films underwent plasma treatment process having a duration of about 30 minutes in which plasma is turned on, performed using a plasma power of about 200 Watts (W), at a reactor chamber pressure of about 2 Torr and a susceptor temperature of about 400° C., with the flow rate of $H_2$ about 50 standard cubic centimeters per minute (sccm), and the flow rate of Ar selected, for example, to achieve the reactor chamber pressure of about 2 Torr during the plasma treatment process (e.g., about 600 sccm). In some embodiments, the flow rate of Ar can be selected, for example, to achieve the reactor chamber pressure of about 2 Torr during the plasma treatment process. The plasma treatment process can be performed after performing a number of complete cycles for depositing a SiCN film. The table of FIG. 13 shows measured compositions of the SiCN-1 and SiCN-2 films, expressed in atomic %, before and after being subjected to the plasma treatment measured, based on both a sample having as-received sample surface (e.g., a sample surface without or substantially without a surface cleaning process, for example such that the sample surface may contain one or more atmospheric contaminants), and a sample after 80 Å of sputtering (e.g., after 80 Å of each SiCN film was sputtered prior and/or removed from the film surface prior to conducting the XPS analysis for determining bulk composition). The table of FIG. 14 shows carbon (C) chemical state, expressed in atomic % C. The table of FIG. 14 shows atoms to which carbon in the film are bonded. The atomic % C of the table in FIG. 14 adds up to equal or substantially equal the corresponding C concentration shown in the table of FIG. 13. As shown in FIGS. 13 and 14, in some embodiments, the plasma treatment may advantageously not significantly change the film compositions. For example, the table of FIG. 14 shows a difference of about 2 atomic % C—Si bonding to the sample surfaces after the H plasma treatment.

Although this disclosure has been provided in the context of certain embodiments and examples, it will be understood by those skilled in the art that the disclosure extends beyond the specifically described embodiments to other alternative embodiments and/or uses of the embodiments and obvious modifications and equivalents thereof. In addition, while several variations of the embodiments of the disclosure have been shown and described in detail, other modifications, which are within the scope of this disclosure, will be readily apparent to those of skill in the art based upon this disclosure. It is also contemplated that various combinations or sub-combinations of the specific features and aspects of the embodiments may be made and still fall within the scope of the disclosure. It should be understood that various features and aspects of the disclosed embodiments can be combined with, or substituted for, one another in order to form varying modes of the embodiments of the disclosure. Thus, it is intended that the scope of the disclosure should not be limited by the particular embodiments described above.

The headings provided herein, if any, are for convenience only and do not necessarily affect the scope or meaning of the devices and methods disclosed herein.

What is claimed is:

1. A method for forming a plasma-treated film on a substrate comprising:
    depositing a thin film on the substrate by a plurality of deposition cycles each comprising alternately and sequentially contacting the substrate with a first vapor-phase silicon precursor comprising two silicon atoms bound to a hydrocarbon in an Si—R—Si— structure, where R comprises a $C_1$ to $C_8$ hydrocarbon, and a second vapor-phase nitrogen reactant; and
    subsequently exposing the substrate to a hydrogen-containing plasma generated from a reactant gas that comprises $H_2$,
    wherein a ratio of a wet etch rate of the plasma-treated film on the sidewall region of a three-dimensional structure to a wet etch rate of the treated thin film on the top region of the three-dimensional structure is less than 3 as measured in a dilute aqueous solution of hydrofluoric acid having a concentration of 0.5 weight %.

2. The method of claim 1, wherein the plasma-treated film has a wet etch rate that is less than about 50% of the wet etch rate of thermal silicon oxide, as measured in dilute hydrofluoric acid having a concentration of 0.5 weight %.

3. The method of claim 1, wherein the plasma-treated film has a wet etch rate of less than about 1 nm/min in a dilute aqueous solution of hydrofluoric acid having a concentration of 0.5 weight %.

4. The method of claim 1, wherein the plurality of deposition cycles are part of a thermal atomic layer deposition (ALD) process.

5. The process of claim 1, wherein the thin film is deposited at a temperature of 300 to 600° C.

6. The method of claim 1, wherein the reactant gas comprises a noble gas.

7. The method of claim 6, wherein the reactant gas comprises one or more of $N_2$, $H_2$ and Ar.

8. The method of claim 6, wherein the reactant gas consists of hydrogen gas ($H_2$) and a noble gas.

9. The method of claim 1, wherein the thin film is exposed to the hydrogen-containing plasma for at least 30 seconds.

10. The method of claim 9, wherein the thin film is exposed to the hydrogen-containing plasma for at least 10 minutes.

11. The method of claim 1, wherein the hydrogen-containing plasma is generated by applying RF power from about 100 W to about 500 W to the reactant gas.

12. The method of claim 1, wherein exposing the thin film to the hydrogen-containing plasma comprises a plurality of cycles in which the plasma is turned on for a first duration of time and turned off for a second duration of time.

13. The method of claim 12, wherein the duration in which the plasma is turned on differs in two or more cycles.

14. The method of claim 1, wherein the deposited thin film comprises carbon.

15. The method of claim 1, wherein the nitrogen reactant comprises a hydrogen atom bonded to a nitrogen atom.

16. The method of claim 1, wherein the nitrogen reactant is $NH_3$.

17. The method of claim 1, wherein in the silicon precursor R comprises a $C_1$ to $C_3$ alkyl chain.

18. The method of claim 1, wherein the silicon precursor is a halogen substituted silylalkane.

19. The method of claim 1, wherein the silicon precursor comprises an unsubstituted silylalkane.

20. The method of claim 19, wherein the silicon precursor comprises bis(silyl)alkane, tris(silyl)alkane or tetrakis(silyl)alkane.

21. The method of claim 1, wherein the silicon precursor comprises bis(trichlorosilyl)methane (BTCSMe) or 1,2-bis(trichlorosilyl)ethane (BTCSEt).

* * * * *

UNITED STATES PATENT AND TRADEMARK OFFICE
CERTIFICATE OF CORRECTION

PATENT NO. : 10,199,211 B2
APPLICATION NO. : 15/820916
DATED : February 5, 2019
INVENTOR(S) : Viljami J. Pore Page 1 of 1

It is certified that error appears in the above-identified patent and that said Letters Patent is hereby corrected as shown below:

In the Claims

Column 26, Line 14, Claim 1, change "Si—R—Si—" to -- —Si—R—Si— --.

Column 26, Line 38, Claim 5, change "process" to --method--.

Signed and Sealed this
Twenty-eighth Day of May, 2019

Andrei Iancu
*Director of the United States Patent and Trademark Office*